United States Patent
Matsumoto et al.

(10) Patent No.: US 11,516,421 B2
(45) Date of Patent: Nov. 29, 2022

(54) SOLID-STATE IMAGING DEVICE

(71) Applicant: RENESAS ELECTRONICS CORPORATION, Tokyo (JP)

(72) Inventors: Osamu Matsumoto, Tokyo (JP); Masanori Otsuka, Tokyo (JP); Fukashi Morishita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 172 days.

(21) Appl. No.: 16/737,527

(22) Filed: Jan. 8, 2020

(65) Prior Publication Data
US 2020/0244908 A1  Jul. 30, 2020

(30) Foreign Application Priority Data

Jan. 25, 2019  (JP) .............. JP2019-010937

(51) Int. Cl.
| | |
|---|---|
| *H04N 5/378* | (2011.01) |
| *H03M 1/56* | (2006.01) |
| *H04N 5/351* | (2011.01) |
| *H03M 1/34* | (2006.01) |
| *H03K 5/24* | (2006.01) |

(52) U.S. Cl.
CPC .............. *H04N 5/378* (2013.01); *H03K 5/24* (2013.01); *H03M 1/34* (2013.01); *H03M 1/56* (2013.01); *H04N 5/351* (2013.01)

(58) Field of Classification Search
CPC .......... H04N 5/378; H04N 5/351; H03K 5/24; H03M 1/34; H03M 1/56
See application file for complete search history.

(56) References Cited

U.S. PATENT DOCUMENTS

| | | |
|---|---|---|
| 7,683,307 B2 | 3/2010 | Kawaguchi et al. |
| 9,106,859 B2 | 8/2015 | Kizuna et al. |
| 2018/0152656 A1* | 5/2018 | Matsumoto ........... H03M 1/765 |

FOREIGN PATENT DOCUMENTS

| | | |
|---|---|---|
| JP | 4661876 B2 | 3/2011 |
| JP | 2011-114785 A | 6/2011 |
| JP | 2013-098895 A | 5/2013 |

\* cited by examiner

*Primary Examiner* — Ahmed A Berhan
*Assistant Examiner* — Fayez A Bhuiyan
(74) *Attorney, Agent, or Firm* — McDermott Will & Emery LLP

(57) ABSTRACT

A solid-state imaging device capable of suppressing variations in reference voltages and improving performance of reference voltages is provided. According to one embodiment, the solid-state imaging device includes a pixel outputting a luminance signal voltage corresponding to an amount of incident light, reference voltages, a reference voltage generation circuit outputting a ramp signal and an inverse ramp signal, and an AD converter, and the AD converter includes a comparator including an amplifier coupled to one input terminal, a reference voltage and an input terminal coupled to each of the ramp signals via a capacitor, and an input terminal coupled to each of the reference voltage and the ramp signal via a capacitor, and a ramp current cancel circuit coupled to each of the reference voltages via a cancel capacitor.

20 Claims, 26 Drawing Sheets

"+": LOGICAL SUM
"*": LOGICAL CONJUNCTION
"!": NOT OPERATION

WHEN THE RESULT OF THE LOGICAL EXPRESSION IS 1, SWITCHED ON

SWA = P01
SWB = P02 + (P05 * ! MSB)
SWC = P03 + (P05 * MSB)
SWD = P04 + (P05 * ! MSB)
SWE = P05 * MSB

"+": LOGICAL SUM
"*": LOGICAL CONJUNCTION
"!": NOT OPERATION

WHEN THE RESULT OF THE LOGICAL
EXPRESSION IS 1, SWITCHED ON

SW1 = P04 + (P05 * ! MSB)
SW2 = (P05 * MSB)

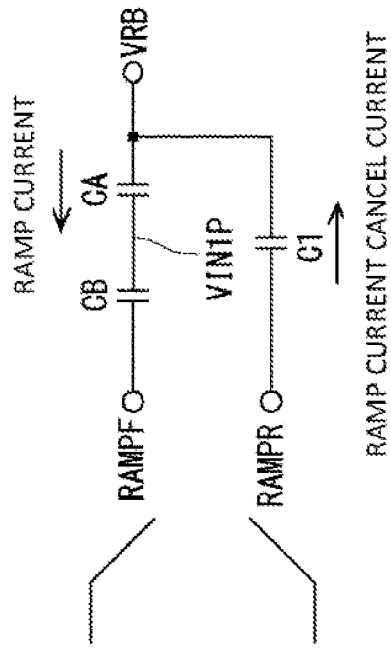
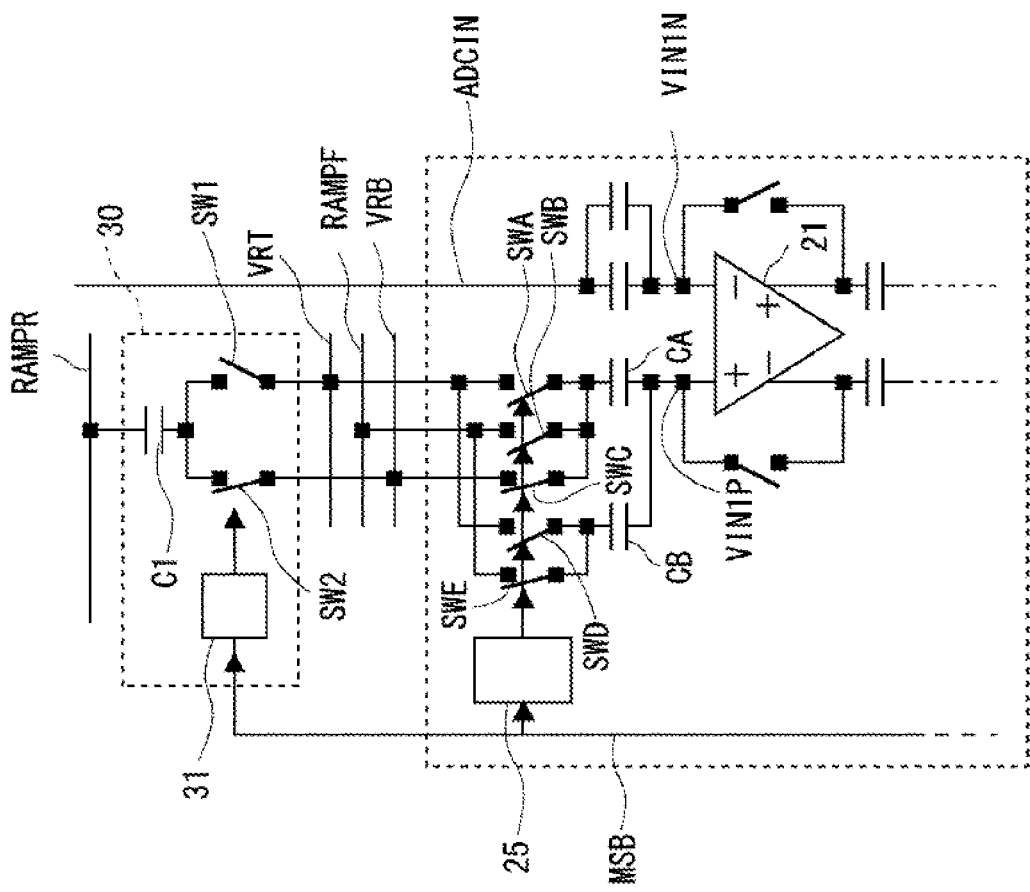

SOLID-STATE IMAGING DEVICE

CROSS-REFERENCE TO RELATED APPLICATIONS

The disclosure of Japanese Patent Application No. 2019-010937 filed on Jan. 25, 2019 including the specification, drawings and abstract is incorporated herein by reference in its entirety.

BACKGROUND

The present invention relates to a solid-state imaging device, for example, a solid-state imaging device such as a CMOS(Complementary Metal Oxide Semiconductor) image sensor incorporating an analog-to-digital converter (also referred to as ADC) or the like.

In a CMOS image sensor incorporating an AD converter, when AD conversion is performed by dividing the input range of the AD converter into a plurality of sub-ranges, a discontinuous conversion characteristic occurs at the boundaries of the ranges, and a linearity deteriorates. Therefore, complicated calibration is required. This is because when the number of divisions is larger than two, not only the offset of the boundary but also the conversion gain of each sub-range needs to be corrected. On the other hand, in the method of converting in two sub-ranges, the calibration of the inclination is unnecessary. For this reason, it is effective to achieve both high speed and calibration.

The comparator used in the AD converter compares a luminance signal voltage output from a pixel with a reference voltage. In order to amplify the difference between the luminance signal voltage and the reference voltage with a sufficient gain, single-stage or multiple-stage of preamplifiers are used.

There are disclosed techniques listed below.
[Patent Document 1] Japanese Unexamined Patent Application Publication No. 2011-114785
[Patent Document 2] Japanese Unexamined Patent Application Publication No. 2013-098895
[Patent Document 3] Japanese Patent No. 4661876

SUMMARY

In a two-stage integration type of ADC, a current flowing from a ramp signal via a capacitor may flow into a VRT line or a VRB line which the reference voltage is outputted during a Fine conversion period. In this case, IR drop due to wiring resistance fluctuates the reference voltage. When a Coarse conversion is performed on an upper one bit, the ramp current is large, and the method of converting in two sub-ranges mentioned above is most susceptible to the effect out of the two-stage integration type ADC. For example, when the VRB line is selected as the reference voltage, the ramp current flows into the VRB line via a capacitor in accordance with a sweep of the ramp signal. The ramp current flowing into the VRB line flows across the VRB line common to each column of the ADC. Due to the influence of a parasitic resistance, the reference voltage of the VRB line fluctuates depending on the column position, and the lateral smear characteristic deteriorates. The same problem occurs when the VRT line is selected as the reference voltage. Which of the VRT line and the VRB line is coupled depends on the input luminance signal voltage, that is, an image. Since such a variation in the reference voltage is caused by the parasitic resistance of the VRT line and the VRB line common to the columns, widening the VRT line and the VRB line can reduce the resistance value. However, a chip area increases.

A first amplifier of a comparator needs to be operated at higher power supply voltages (e.g., 3 3V) in order to be able to receive wide pixel signal amplitudes (e.g., 1 2V). In a conventional comparator, an output of the first amplifier is directly coupled to an input of a second amplifier. Therefore, a power supply voltage of the second amplifier needs to be set to 3 3V, which is the same as the power supply voltage of the first amplifier.

Other problems and novel features will become apparent from the description of this specification and the accompanying drawings.

According to one embodiment, a solid-state imaging device comprising a pixel configured to output a luminance signal voltage corresponding to an incident light amount to a luminance signal line, a reference voltage generating circuit configured to output a first reference voltage to a first reference voltage line, a second reference voltage to a second reference voltage line, a ramp signal having a predetermined slew rate to a ramp signal line, and an inverse ramp signal having a different direction with the ramp signal to an inverse ramp signal line, and an AD converter configured to preform AD conversion of the luminance signal voltage. The AD converter comprises a comparator comprising an amplifier, the amplifier comprises a first input terminal coupled to the luminance signal line, and a second input terminal configured to connect or disconnect to the first reference voltage line, the second reference voltage line, and the ramp signal line respectively, and a rump current chancel circuit configured to connect or disconnect the inverse ramp line to the first reference voltage line and second reference voltage line respectively.

In accordance with one embodiment, a solid-state imaging device capable of suppressing fluctuations in reference voltages, improving performance, and consuming less power is presented.

BRIEF DESCRIPTION OF THE DRAWINGS

FIG. 14A illustrates a circuit diagram of a vicinity of the first amplifier when MSB is at H-level at the time of Signal voltage conversion in the solid-state imaging device according to the first embodiment.

FIG. 14B illustrates an equivalent circuit focusing on an inverse ramp signal, a ramp signal, and a reference voltage VRB according to the first embodiment.

DETAILED DESCRIPTION

Figure 1:
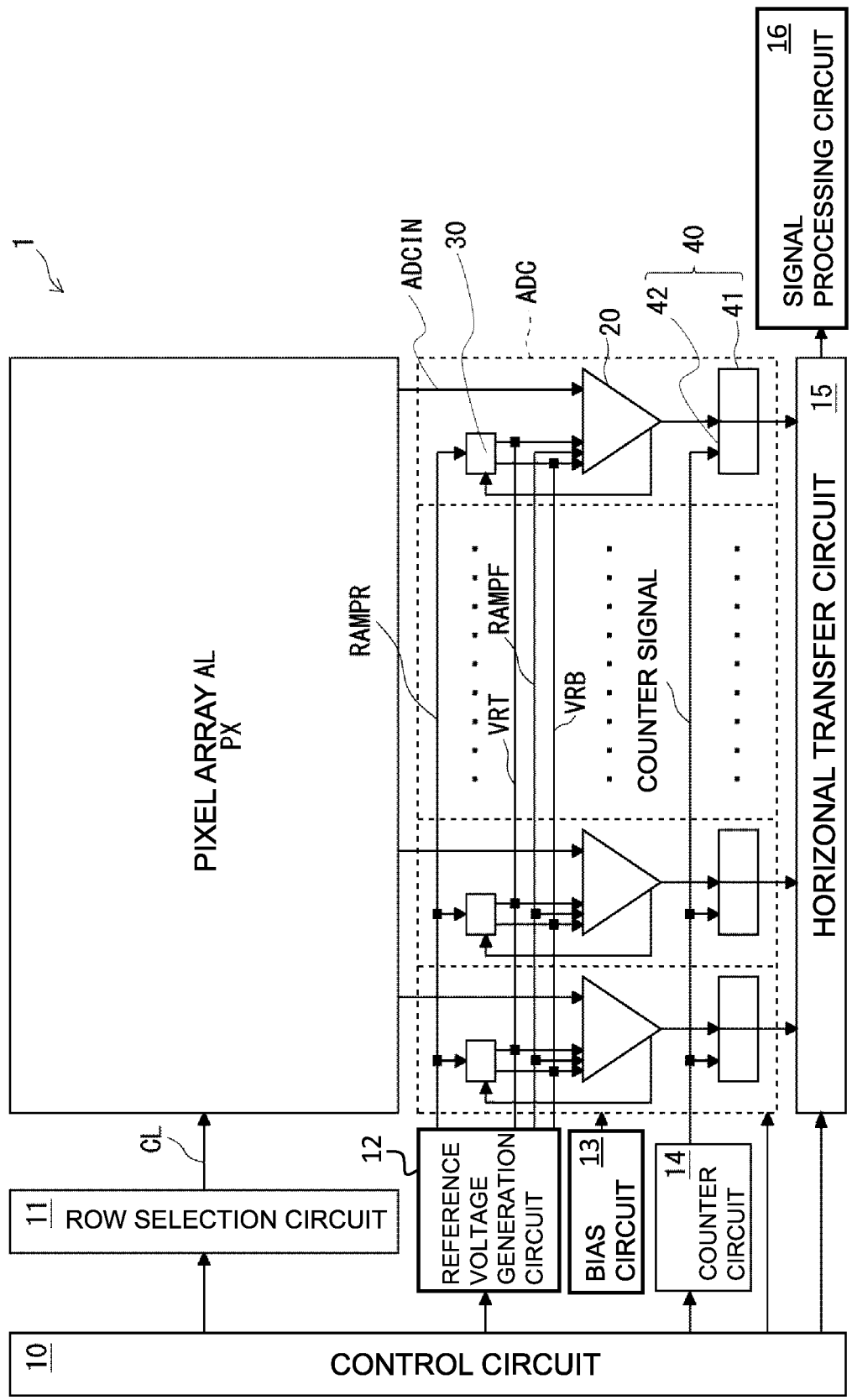
FIG. 1 illustrates an example of a solid-state imaging device according to a first embodiment.

For clarity of explanation, the following description and drawings are appropriately omitted and simplified. In the drawings, the same elements are denoted by the same reference numerals, and a repetitive description thereof is omitted as necessary.

In order to clarify a solid-state imaging device of a first to fourth embodiments, problems in the solid-state imaging device found by the present inventor will be described.

In recent years, CMOS image sensors with built-in ADC have been actively developed. In CMOS image sensor, there is a marketing request for improved frame rate. In order to improve the frame rate, Patent Document 1 discloses a two-stage conversion, and Patent Document 2 discloses three-stage conversion. In these AD converters, reference voltages VRT and VRB and ramp signal RAMPF are used as reference voltage used for conversion. A VRT line and a VRB line to which these reference voltages are outputted are, for example, horizontally wired in the CMOS image sensor, and are commonly used among the AD converters. Note that a line to which the reference voltage VRT is outputted is referred to as the VRT line. Similarly, a line to which the reference voltage VRB is outputted is referred to as the VRB line. A signal line from which the ramp signal RAMPF is outputted is referred to as a RAMPF signal line.

In a conventional AD converter, in a Fine conversion, there is a problem that errors occur in the reference voltages VRT and VRB due to the current flowing from the ramp signal RAMPF and the wiring resistance, thereby resulting in a lateral smearing. In these AD converter, the upper 3 bits (Patent Document 1) and the upper 5 bits (Patent Document 2) are determined prior to the Fine conversion. The larger the number of high-order bits to be determined, the shorter the Fine transformation time can be. However, there is a problem that the number of control circuits and switches for determining the connection destination of the capacitor increases and the area increases.

In addition, calibration for reducing discontinuity of input/output characteristics in the vicinity of the boundary between two adjacent sub-ranges becomes complicated, thereby causing an increase in the number of calibration circuits and an increase of the calibration time. Therefore, a two-stage AD converter having a simple calibration mechanism, a small area, and high-order 1-bit is required.

However, in the two-stage conversion of the high-order 1-bit signal, the capacitor coupled to the RAMPF signal line becomes ½ of the total capacitance of the reference-voltage-side capacitor, which is larger than the two-stage conversion of the high-order 2-bit signal line or more. Therefore, the problem of lateral smearing due to the above-mentioned current becomes more severe. For example, two capacitors having equal capacitance values are coupled to the reference voltage side. It is assumed that the total capacitance value of the capacitors coupled to the reference voltage side is Ctot, and the capacitance value of the respective capacitors is Ctot/2. During the Fine conversion period, one of the two capacitors is coupled to the RAMPF signal line, and the other capacitor is coupled to the VRT line or the VRB line in accordance with a luminance signal voltage.

Figure 25:
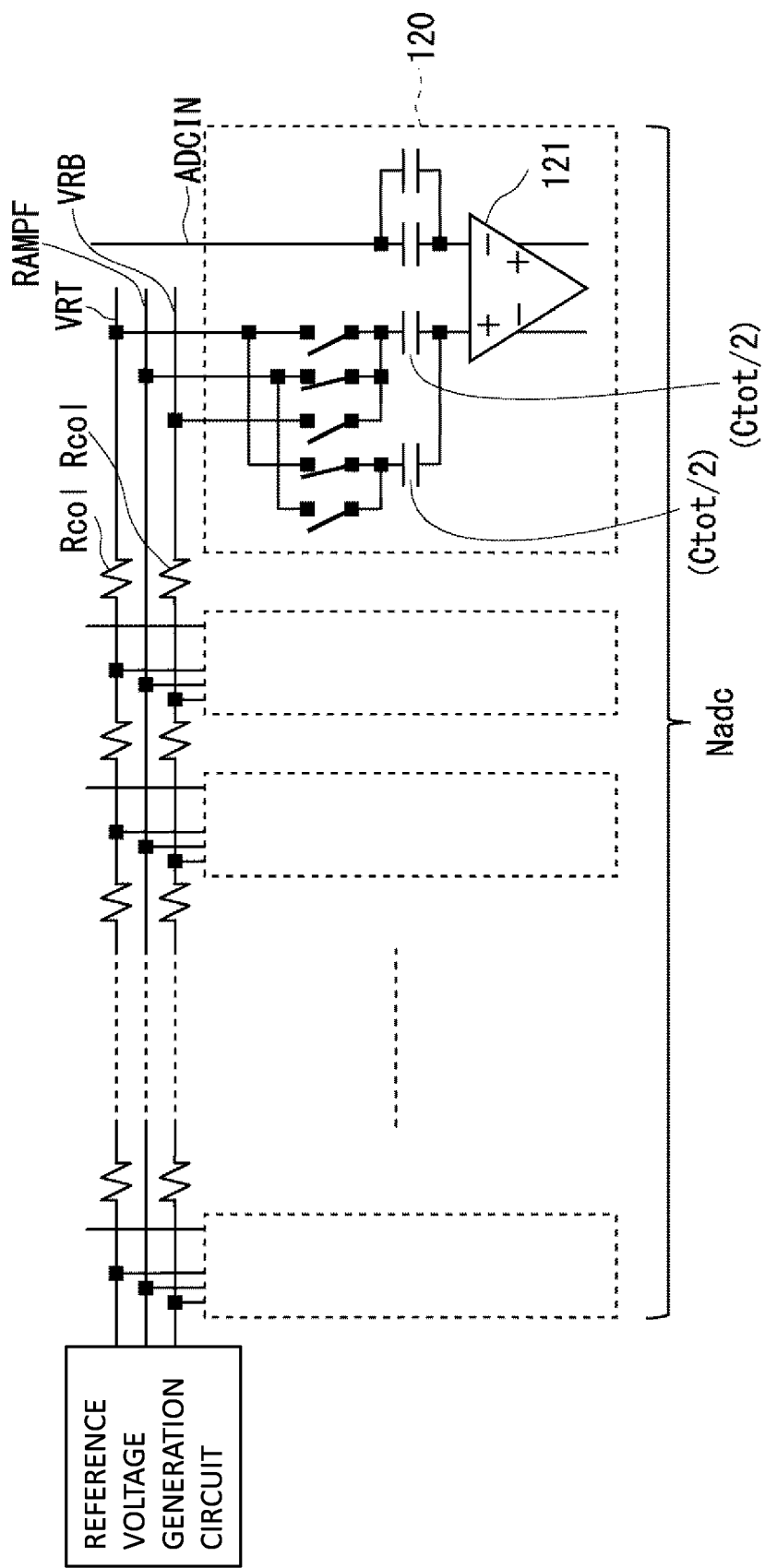
FIG. 25 illustrates an example a CMOS image sensor.

As shown in FIG. 25, the CMOS image sensor is provided with a plurality of AD converters. A reference voltage generating circuit generates reference voltages VRT and VRB and ramp signal RAMPF. In all the comparators 120 in the CMOS image sensor, when the capacitor that is not coupled to the RAMPF line is coupled to the VRT line, the largest error voltage generated in the reference voltage VRT is calculated. Two (Ctot/2) capacitors are coupled in series from the RAMPF signal line to the VRT line. When the input capacitor of the first amplifier 121 and the parasitic capacitor of a wiring are ignored, the equivalent capacitor of (Ctot/4) is coupled between the RAMPF signal line and the VRT line.

Figure 26:
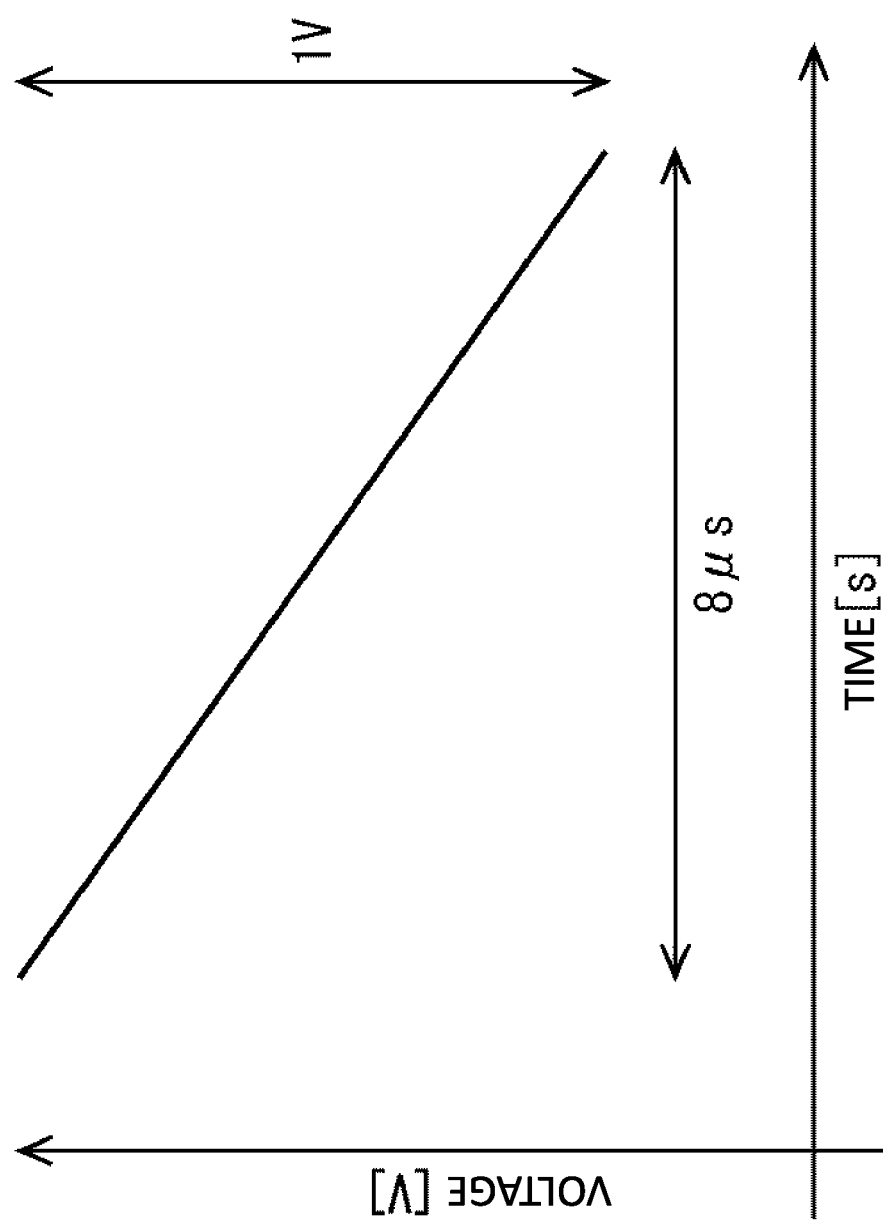
FIG. 26 illustrates an example of a graph of a ramp signal, in which a horizontal axis represents time and a vertical axis represents voltage.

As shown in FIG. 26, if it is assumed that the ramp signal decreases by 1V during 8 μs, the slew rate (dV/dt) is −125 KV/s. Assuming that the total capacitance Ctot of the capacitors coupled to the reference voltage side is 0.5 pF, a ramp current of (dV/dt)×(Ctot/4)=−15.625 nA flows for each ADC.

Assuming that the wiring resistance of the VRT line between neighboring AD converters are Rcol=0.01Ω, and the number of ADCs is Nadc=4000, the error voltage VRTerr of the reference voltage VRT in the AD converter farthest from the reference voltage generating circuit is obtained by the following equation.

$$VRTerr = Nadc \times (Nadc+1)/2 \times Rcol \times (dV/dt) \times (Ctot/4) = -1.25 \text{ mV}$$

The error voltage depends on whether the reference-voltage-side capacitor, which is not coupled to the RAMPF signal line, is coupled to the VRT line or the VRB line during the Fine conversion. Therefore, it becomes an image dependent error voltage and image degradation of lateral smear. Note that the same error voltage is generated due to the wiring resistance of the RAMPF signal line, regardless whether the reference-voltage-side capacitor that is not coupled to the RAMPF signal line is coupled to the VRT line or the VRB line during the Fine conversion period. Therefore, the error is cancelled by subtracting the result of the conversion of the Dark signal and the conversion of the Signal signal, which is referred to as digitally correlated double sampling.

As described above, a problem is found that a ramp current flows through the VRT line and the VRB line when the 1-bit two-stage conversion ADC is used in the solid-state imaging device. Such ramp currents vary the reference voltages VRT and VRB. Therefore, it is difficult to improve the performance of the solid-state imaging device.

In addition, in a battery-driven image sensor such as a digital camera or a cellular phone, there is a strong demand for low power consumption. The number of ADCs mounted on the CMOS image sensor is generally several thousand, and the reduction of the ADC power is required. Therefore, a solid-state imaging device that reduces power consumption is also proposed.

First Embodiment

A solid-state imaging device according to the first embodiment will be described. FIG. 1 illustrates an example of a solid-state imaging device according to the first embodiment. As shown in FIG. 1, the solid-state imaging device 1 includes a pixel array AL, a control circuit 10, a row selection circuit 11, a reference voltage generation circuit 12, a bias circuit 13, a counter circuit 14, a horizontal transfer circuit 15, a signal processing circuit 16, and a plurality of AD converters. The solid-state imaging device 1 is, for example, a CMOS image sensor.

The row selection circuit 11 is controlled by the control circuit 10, and sequentially selects one row of the pixel array AL which is a plurality of pixels PX are arranged in a matrix form in a plurality of rows and a plurality of columns, and enables a control line of the selected row.

The pixel array AL includes the plurality of pixels PX. In the pixel array AL, the plurality of the pixels PX are arranged in a matrix form composed of a plurality of rows and a plurality of columns. Each pixel PX is activated in response to a corresponding control line CL being activated. The activated pixels PX then output the luminance signal voltage having a voltage corresponding to the amount of incident light to a corresponding luminance signal line ADCIN. The operation of the pixel PX is controlled by the control circuit 10.

<About Pixels>

Figure 2:
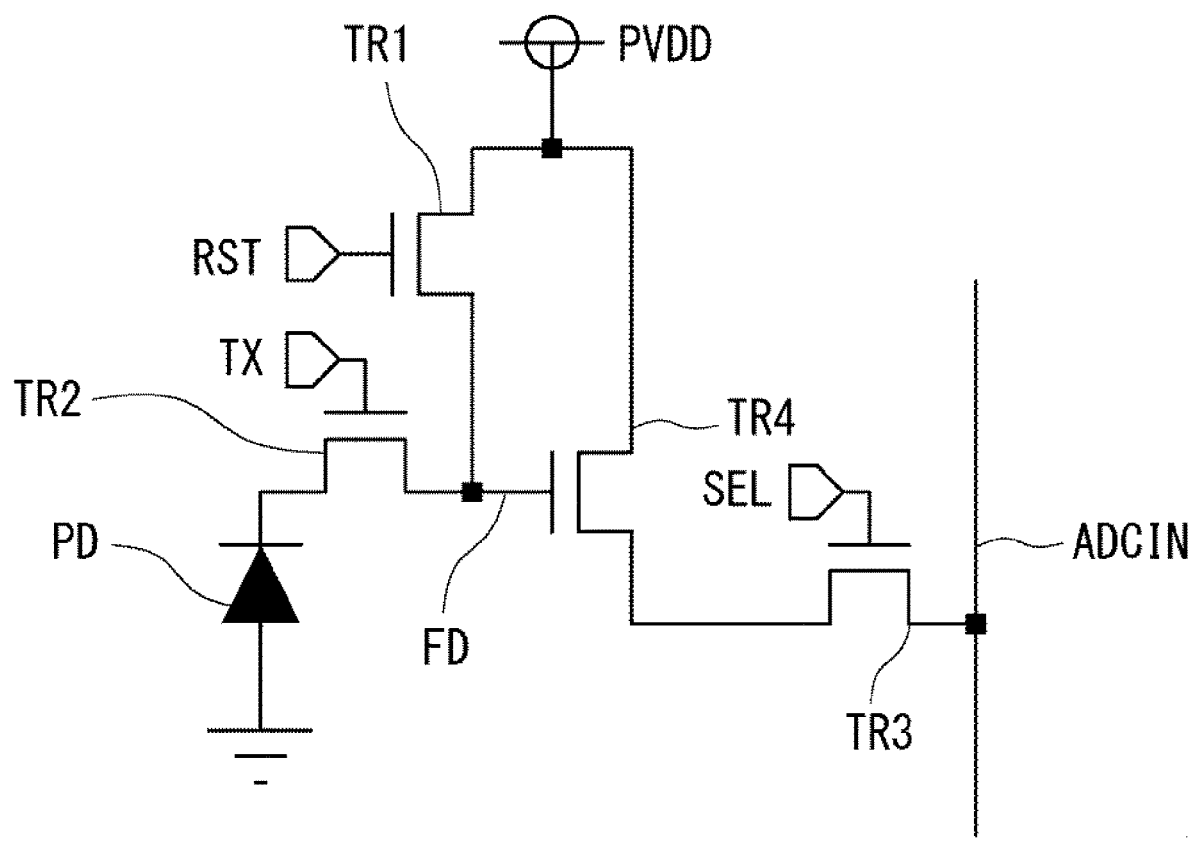
FIG. 2 illustrates an example of a pixel of the solid-state imaging device according to the first embodiment.

FIG. 2 illustrates an example of a pixel of the solid-state imaging device according to the first embodiment. The pixel PX includes a photoelectric conversion element photodiode PD and, for example, four transistors. The four transistors are, for example, a reset transistor TR1, a transfer transistor TR2, a row selection transistor TR3, and an amplifier transistor TR4.

The reset transistor TR1 resets a floating diffusion FD to a predetermined voltage level in accordance with an reset control signal RST. The transfer transistor TR2 transmits an electric signal generated by the photodiode PD in accordance with a transfer control signal TX. The row selection transistor 3 outputs a signal transmitted from the amplifier transistor TR4 to the luminance signal line ADCIN in accordance with a row selection signal SEL. The amplifier transistor TR4 amplifies a potential of the floating diffusion FD.

The photodiode PD photoelectrically converts an amount of electrons corresponding to the amount of incident light. The transfer transistor TR2 is turned on when the transfer control signal TX is at a high level, and transfers electrons photoelectrically converted by the photodiode PD to the floating diffusion FD.

When a row selection signal SEL becomes H level, the amplifier transistor TR4 and the luminance signal line ADCIN are coupled to each other. The floating diffusion FD is coupled to a gate electrode of the amplifier transistor TR4, and forms pixel current source and source follower circuits. A voltage corresponding to the potential of the floating diffusion FD is outputted to the luminance signal line ADCIN thereby.

More specifically, when the pixel PX is set to H level and the transfer transistor TR2 is switched on, the electric charge of the photodiode PD is transferred to the floating diffusion FD to initialize the photodiode PD. Next, the pixel PX is set to L-level to switch off the transfer transistor TR2, and photoelectric conversion is performed for a predetermined period to accumulate charges.

At the time of reading, by setting the reset control signal RST to the H level, the reset transistor TR1 becomes conductive and the floating diffusion FD is reset. Subsequently, by a row select signal SEL becoming H level, the row select transistor TR3 is coupled to the luminance signal line ADCIN, thereby forming a source follower circuit. When the reset control signal RST becomes L level and the reset transistor TR1 is switched off, a voltage in a dark state (also referred to as "Dark voltage") before being transmitted from photodiode PD is outputted to the luminance signal line ADCIN.

Next, the transfer control signal TX becomes H-level, and the transfer transistor TR2 becomes conductive, and a charge photoelectrically converted and accumulated by the photodiode PD is transferred to the floating diffusion FD. The floating diffusion FD changes in accordance with the transferred charges, and a voltage value (also referred to as a "Signal voltage") corresponding to the light amount of the pixel is outputted to the luminance signal line ADCIN.

By using the difference between the Dark voltage and the Signal voltage as an image signal, a so-called correlated double sampling operation can be performed to cancel out the effects of variation in DC components of the pixels PX and reset noise.

When the reading of the pixels PX is completed, the row selection signal SEL is set to the L level, and the row selection transistor TR3 is switched off. Since each of the reset control signal RST, the transfer control signal TX, and the row selection signal SEL of the reset transistor TR1, the transfer transistor TR2, and the row selection transistor TR3 are shared in units of rows, these read operations are performed in parallel for the pixels PX of one row.

<Operation of AD Converter>

The plurality of AD converters (e.g. thousands) are provided corresponding to the luminance signal line ADCIN. The AD converters are arranged in a column shape in the image sensor, and perform AD conversion to the luminance signal voltage. Each AD converter includes a comparator 20, a ramp current cancel circuit 30, and a latch 40. The latch 40 includes an output MSB latch 41 for capturing a result of the Coarse conversion, and a counter latch 42 whose timing of capturing the counter signals are controlled by an output of the comparator 20.

The counter circuit 14 is controlled by the control circuit 10 and coupled to the latch 40 of each AD converter. The bias circuit 13 supplies a bias voltage to a preamplifier in the comparator 20.

The reference voltage generator 12 generates the reference voltages VRT and VRB, the ramp signal RAMPF, and inverse ramp signal RAMPR. The ramp signal RAMPF is increasing and the inverse ramp signal RAMPR is decreasing. The ramp signal RAMPF and the inverse ramp signal RAMPR have same absolute value of the slew rate. Specifically, the reference voltage generation circuit 12 outputs the reference voltage VRT to the VRT line and outputs the reference voltage VRB to the VRB line. The reference-voltage generator 12 outputs the ramp signal RAMPF having a predetermined slew rate to the RAMPF signal line. And the reference-voltage generator 12 outputs the inverse ramp signal RAMPR having same absolute value of the slew rate as the ramp signal RAMPF and having a different direction with the ramp signal RAMPF to a RAMPR signal line. For example, the reference voltage VRT is higher than the reference voltage VRB.

The device 1 of the present embodiment includes a ramp current cancel circuit 30 in the AD converter. The ramp current cancel circuit 30 is controlled by an output of the comparator 20 and a control signal from the control circuit 10.

Figure 3:
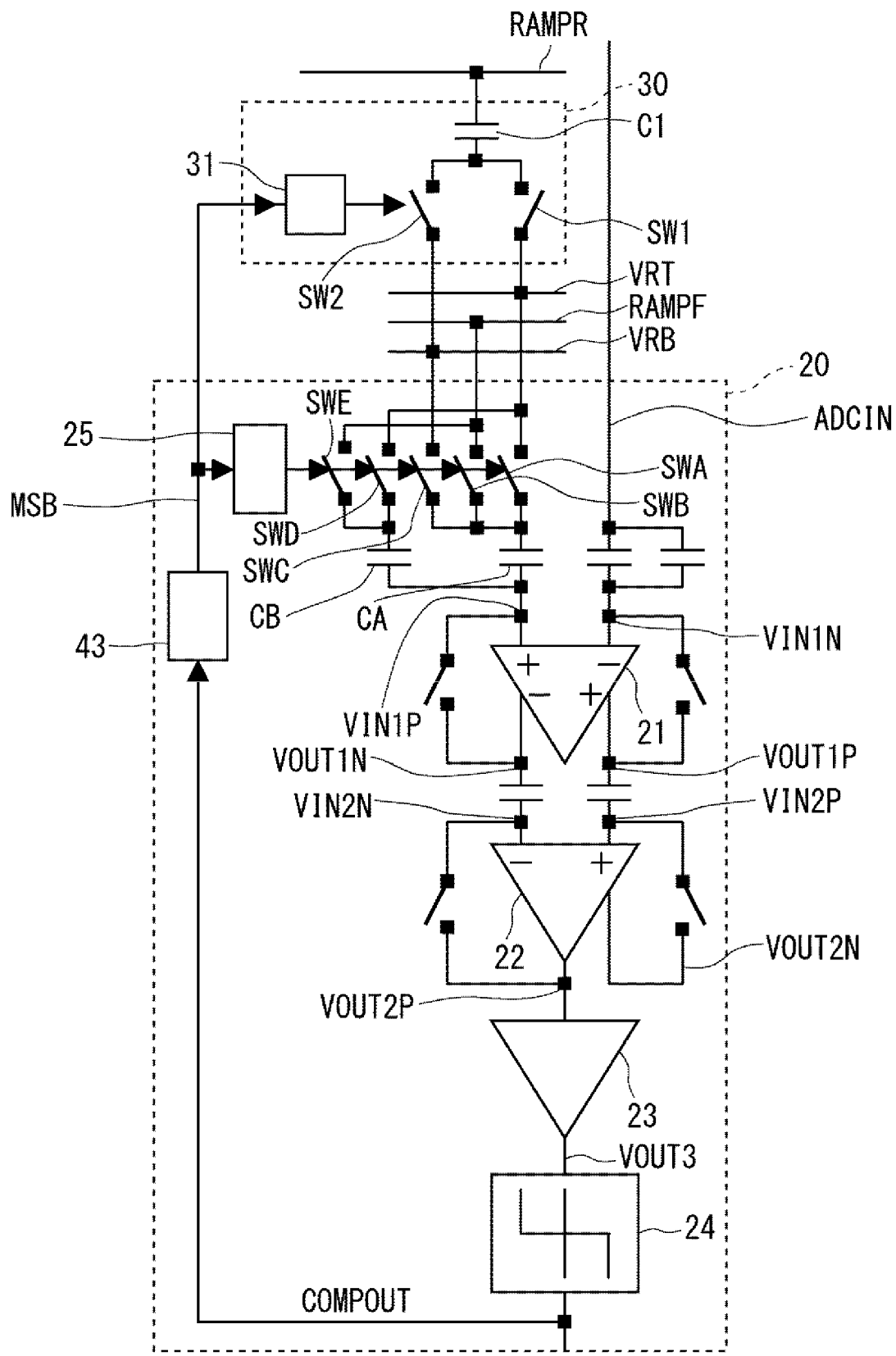
FIG. 3 illustrates an example of a ramp current cancellation circuit and a comparator in the solid-state imaging device according to the first embodiment.

FIG. 3 illustrates an example of the ramp current cancel circuit and the comparator in the solid-state imaging device according to the first embodiment. As shown in FIG. 3, the comparator 20 compares the luminance signal voltage outputted from the pixel PX to the luminance signal line ADCIN with a comparison signal generated by using the reference voltages VRT, VRB and the ramp signal RAMPF. When the comparison signal is smaller than the luminance signal voltage, an output COMPOUT1 operates to output an L-level signal.

The comparator 20 includes one or a plurality of stages of pre-amplifiers and a binarization circuit 24. The example of FIG. 3 shows a three-stage preamplifier of a first amplifier 21, a second amplifier 22, and a third amplifier 23. The comparator 20 includes an MSB latch 43. An output of the binarization circuit 24 is input to the MSB latch 43.

An input terminal VIN1N of the first amplifier 21 and an output terminal VOUT1P of the first amplifier 21 are coupled to a input terminal VIN2P of the second amplifier 22 via a capacitor. An input terminal VIN1P of the first amplifier 21, and an output terminal VOUT1N of the first amplifier 21 are coupled to the input terminal VIN2N of the second amplifier 22 via a capacitor. Therefore, by an auto-zero operation of closing the switch placed between the input/output terminals of the first amplifier 21 and between the input/output terminals of the second amplifier 22, it is possible to operate each amplifier at the optimum operating point without depending on an external signal DC level.

The input terminal VIN1N of the first amplifier 21 is coupled to the luminance signal line ADCIN from the pixel PX via a capacitor. Thus, a voltage corresponding to an input voltage of the luminance signal line ADCIN is generated. Hereinafter, this voltage is referred to as the luminance signal voltage. The input terminal VIN1P of the first amplifier 21 is coupled to the VRT line, the VRB line, and the RAMPF signal line via a capacitor and a switch, and a comparison signal voltage is generated by capacitance division. Specifically, the input terminal VIN1P is coupled to each of the VRT line, the VRB line, and the RAMPF signal line respectively via the capacitor CA by switching on or off switches SWA, SWB and SWC. The input terminal VIN1P is coupled to the VRT line and the RAMPF signal line via a capacitor CB by switching on or off via switches SWD and SWE. For example, the capacitor CA and the capacitor CB have the same capacitance.

The ramp current cancel circuit 30 cancels a ramp current. The ramp current cancel circuit 30 includes a cancel capacitor C1, and the RAMPR signal line is coupled to each of the VRT line and the VRB line respectively via the cancel capacitor C1 by switching on or off cancel switches SW1 and SW2. The ramp current cancel circuit 30 connects the RAMPR signal line to the VRT line or the VRB line via the cancel capacitor C1 in accordance with an output signal MSB. The output signal MSB is an output of the binarization circuit 24 fetched into the MSB latch 43 at a predetermined timing.

The comparator 20 may include a plurality of capacitors in addition to the second amplifier 22, the third amplifier 23, and the binarization circuit 24. The output terminal VOUT1P of the first amplifier 21 is coupled to the input terminal VIN2P of the second amplifier 22 via a capacitor. The output terminal VOUT1N of the first amplifier 21 is coupled to the input terminal VIN2N of the second amplifier 22 via a capacitor. Therefore, capacitors is disposed between the first amplifier 21 and the second amplifier 22. Thus, the power supply voltage of the first amplifier 21 and the power supply voltage of the second amplifier 22 may be different from each other. For example, a power supply voltage of the second amplifier 22 may be smaller than a power supply voltage of the first amplifier 21. By doing this, power consumption can be reduced.

An output terminal VOUT2P of the second amplifier 22 is coupled to an input terminal of the third amplifier 23. An output terminal VOUT3 of the third amplifier 23 is input to the binarization circuit 24. Therefore, the third amplifier 23 is coupled between the second amplifier 22 and the binarization circuit 24. The output terminal of the second amplifier 22 is coupled to the binarization circuit 24 via the third amplifier 23.

Figures 4A, 4B:
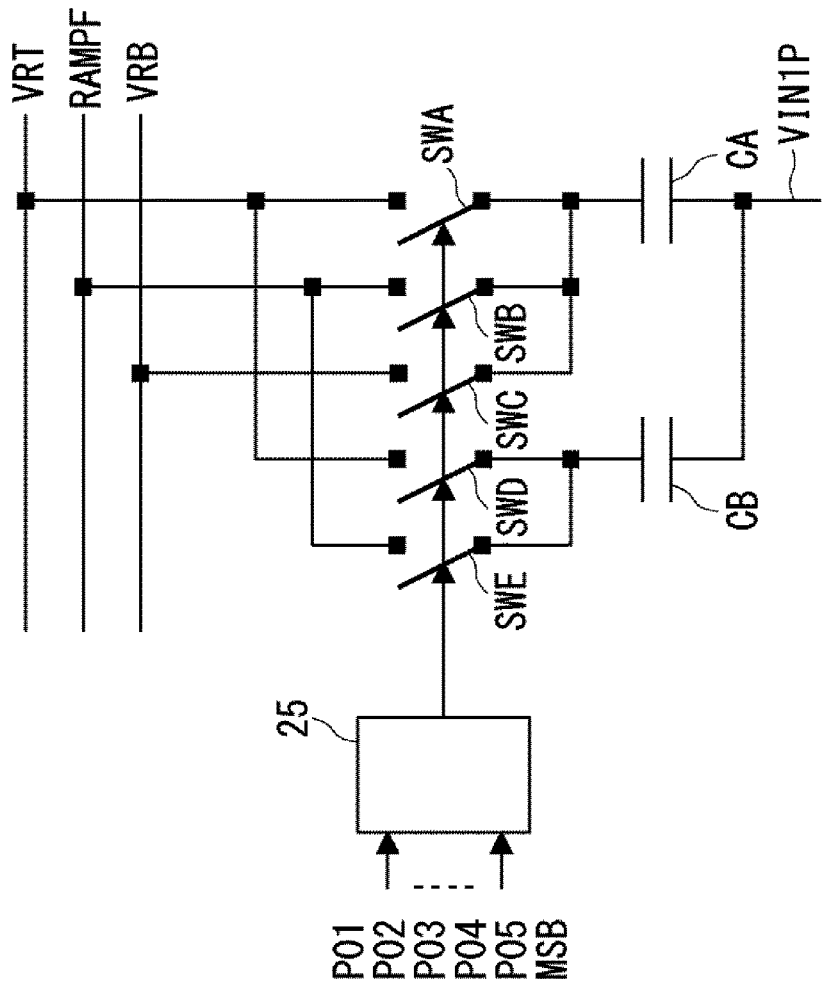
FIG. 4A illustrates an example of a switching control circuit in the solid-state imaging device according to the first embodiment.
FIG. 4B illustrates an example of control signals of the switching control circuit.

FIG. 4A illustrates an example of a switch control circuit in the solid-state imaging device according to the first embodiment. FIG. 4B illustrates an example of control signals of the switch control circuit. As shown in FIG. 4A, the comparator 20 includes a switch control circuit 25, capacitors CA and CB, and switches SWA to SWE. The capacitor CA is coupled to the input terminal VIN1P of the first amplifier 21, and the capacitor CB is coupled to the input terminal VIN1P of the first amplifier 21.

The reference voltage side of the capacitor CA needs to be coupled to either of the VRT line, the VRB line, or the RAMPF signal line. For this purpose, one switch among the three switches SWA to SWC is selected. Specifically, the comparator 20 includes the switch SWA for switching on or off between the capacitor CA and the VRT line, the switch SWB for switching on or off between the capacitor CA and the RAMPF signal line, and the switch SWC for switching on or off between the capacitor CA and the VRB line.

Further, the reference voltage side of the capacitor CB needs to be coupled to either of the VRT line or the RAMPF signal line. For this purpose, one switch among two switches SWD and SWE is selected. More specifically, the comparator 20 includes the switch SWD for switching on or off between the capacitor CB and the VRT line, and the switch SWE for switching on or off between the capacitor CB and the RAMPF line.

The switch control circuit 25 realizes necessary functions by the logical expression shown in FIG. 4B. Here, "+" represents a logical sum, "*" represents a logical conjunction, and "!" represents a not operation, and when the result of the logical expression is 1, the switch is switched on. Capacitors CA and CB have same capacitance value(Ctot/2).

Figures 5A, 5B:
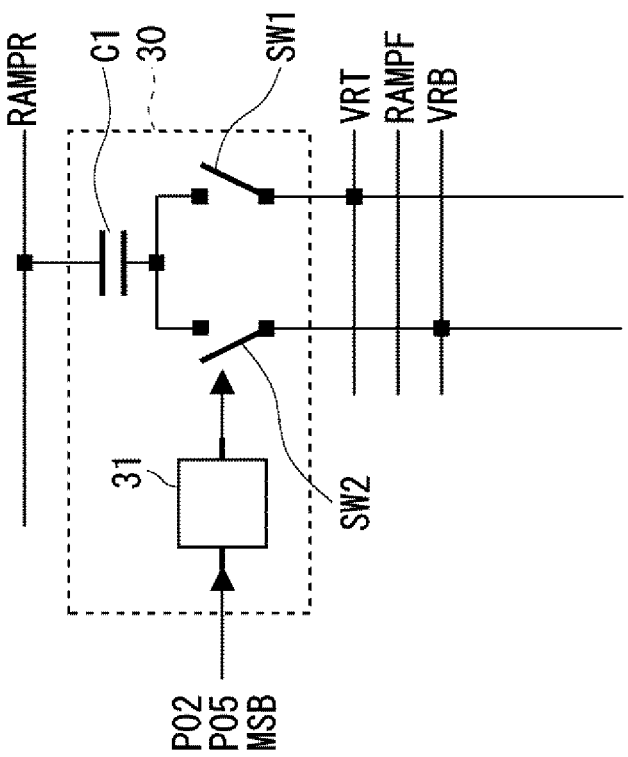
FIG. 5A illustrates an example of a ramp current cancel circuit in the solid-state imaging device according to the first embodiment.
FIG. 5B illustrates an example of control signals of the ramp current cancel control circuit.

FIG. 5A illustrates an example of configuration of the ramp current cancel circuit in the solid-state imaging device according to the first embodiment. FIG. 5B illustrates an example of control signals of the ramp current cancel control circuit. As shown in FIG. 5A, the ramp current cancel circuit 30 includes a cancel capacitor C1, cancel switches SW1 and SW2, and a ramp current cancel control circuit 31. The RAMPR signal line is coupled to the VRT line or the VRB line via the cancel capacitor C1. Specifically, the ramp current cancel circuit 30 includes the cancel switch SW1 for switching on or off between the cancel capacitor C1 and the VRT line, and the cancel switch SW2 for switching on or off between the cancel capacitor C1 and the VRB line.

The ramp current cancel control circuit 31 realizes a necessary function by the logical expression shown in FIG. 5B. The capacitance value of the cancel capacitor C1 is, for example, Ctot/4 when the slew rate and the absolute value of the inverse ramp signal RAMPR is equal to the one of the ramp signal RAMPF, and the direction of the inverse ramp signal RAMPR is opposite to the direction of the ramp signal, and the parasitic capacitance of the input terminal VIN1P is ignored.

Figure 6:
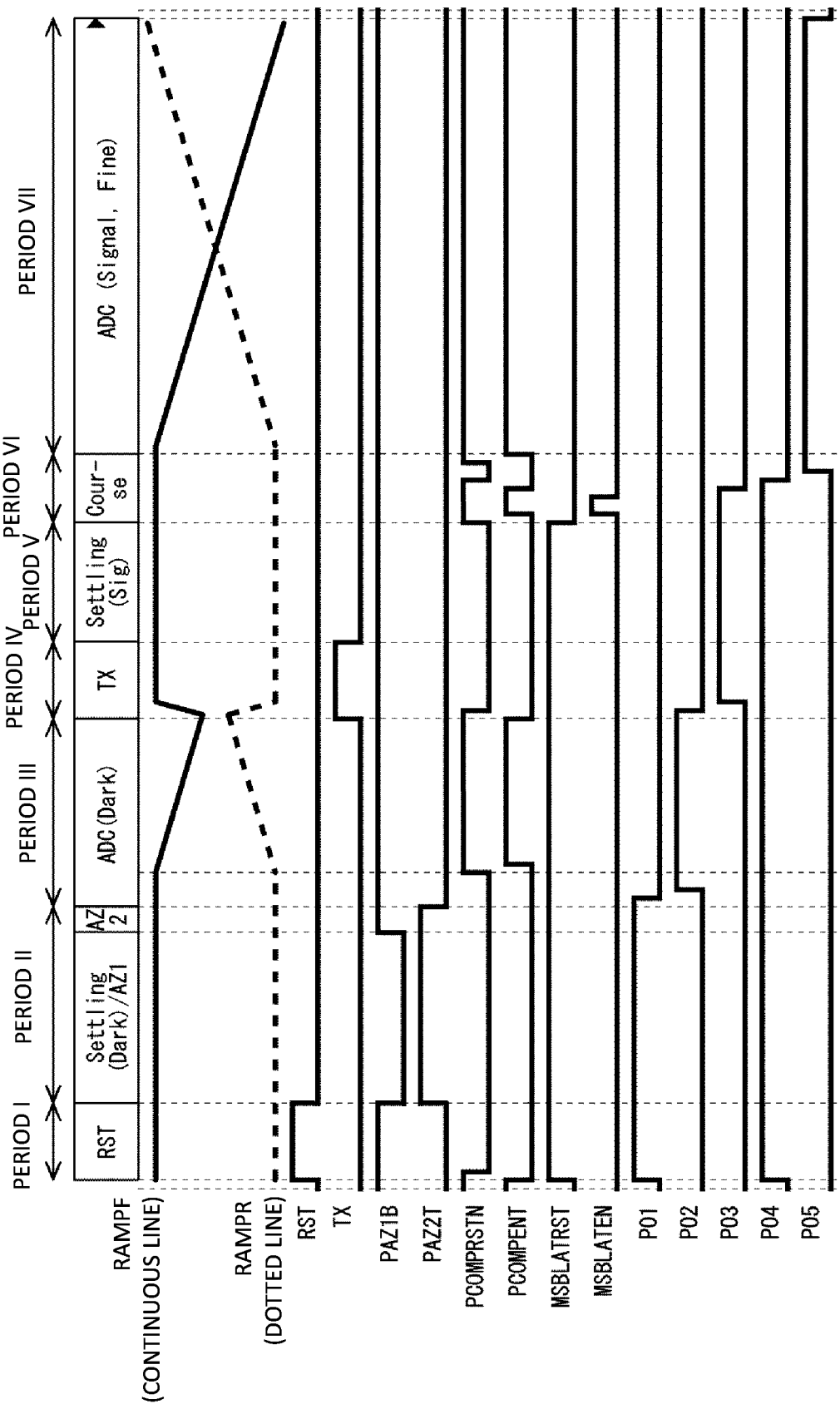
FIG. 6 illustrates a timing chart of the operations of comparator, a ramp current cancel circuit, and a switching control circuit in the solid-state imaging device according to the first embodiment.

Next, operations of the comparator, the ramp current cancel circuit, and the switch control circuit in the solid-state imaging device 1 of the present embodiment are described. FIG. 6 illustrates an example of a timing chart of the operation of the comparator, the ramp current canceling circuit, and the switching control circuit in the solid-state imaging device according to the first embodiment.

First, the details of each pulse shown in FIG. 6 are described. The period of the operation shown in FIG. 6 is a period required for one AD conversion. The period of such operation can be divided into seven phases, period I to period VII, depending on the operating conditions. The period I is a reset period RST. Period II is a set period for the Dark voltages. The period III is an A/D conversion period of the Dark voltages. The period IV is a period for the transfer control signal TX controlling. The period V is a set period for the Signal voltage. Period VI is a Course conversion period. The period VII is a Fine conversion period of the Signal voltages.

The ramp signal RAMPF and the inverse ramp signal RAMPR are swept in the A/D conversion period III of the Dark voltage and the Fine conversion period VII of the Signal voltage, and the predetermined voltage is held in other periods.

Reset control signal RST and transfer control signal TX are pulses for the pixel PX, and reset the pixel PX by making the reset control signal RST pulse active (H level) in period I. In the period IV, the Signal voltages are read out by activating the transfer control signal TX.

Signals PAZ1B, PAZ2T perform an auto-zero operation of the first amplifier 21 and the second amplifier 22 of the comparator 20 In the period II. Each amplifier is self-biased by making the pulse active, i.e., the first amplifier 21 is at the L level and the second amplifier 22 is at the H level.

PCOMPRSTN, PCOMPENT are pulses for controlling the binarization circuit 24 in the comparator 20. The PCOMPRSTN performs a reset operation at the L level, and the PCOMPENT is a pulse to be activated at the H level. In the periods I, II, IV, and V, the reset and the non-enable states are set, and the non-reset and the enable states are set in the Dark voltage conversion (period III), the Course voltage conversion period (period VI), and the Fine conversion period (period VII). Immediately before the Fine converting, i.e. at the end of the period VI, it is reset and de-enabled to prepare for the Fine conversion.

MSBLATRST is a reset pulse of the MSB latch 43. It is reset at H-level and is released just before the Coarse conversion.

MSBLATEN is an enable pulse of the MSB latch 43. The output of the binarization circuit 24 is taken in by activating (H-level) the output after the resetting of the latche at the time of the Coarse conversion is released.

P01 is one of the signals for designating a phase state to the control logic circuit, and it becomes H level during the periods I and II. Likewise, P02 is one of the signals for designating the phase state, and becomes H level in the period III. Likewise, P03 is one of the signals for designating the phase state, and becomes H level in the periods IV, V, and VI. Likewise, P04 is one of the signals for designating the phase state, and becomes H level in the periods I to VI. Likewise, P05 is one of the signals for designating the phase state, and becomes H level in the period VII.

Figure 7:
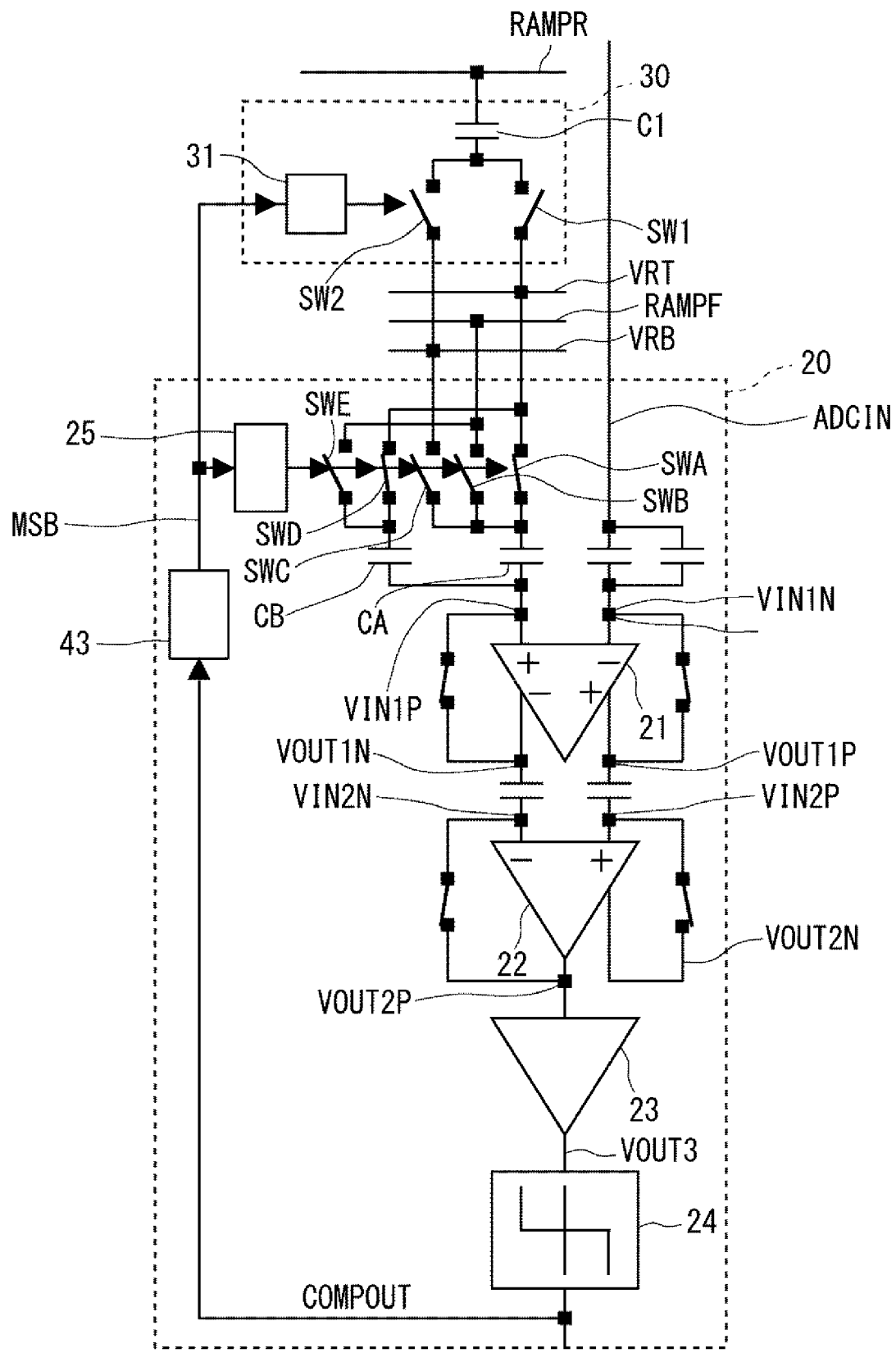
FIG. 7 illustrates a connection of switches during a reset period of comparator in the solid-state imaging device according to the first embodiment, and illustrates a connection state during a period II.
Figure 8:
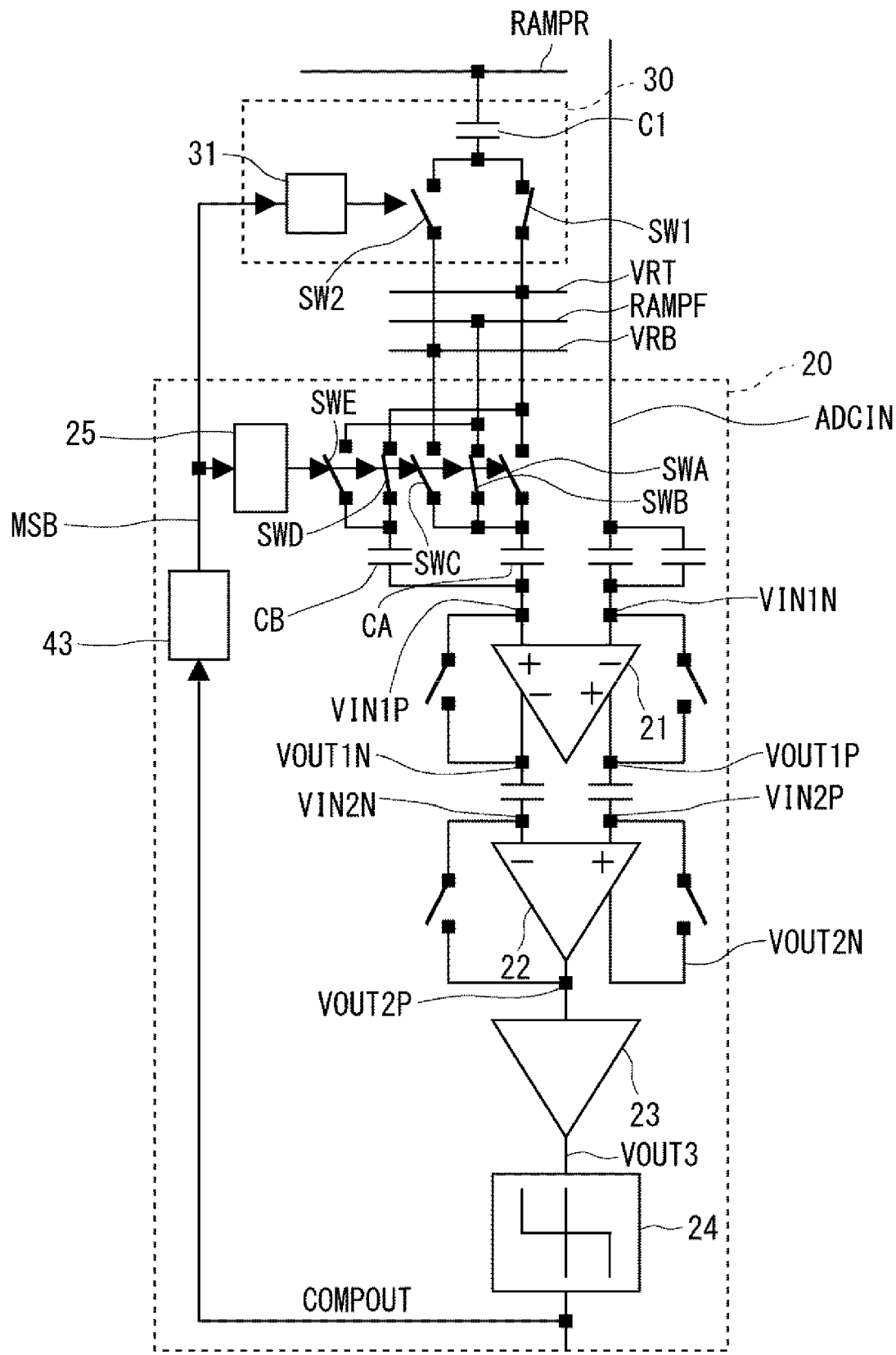
FIG. 8 illustrates an example a connection of switches in a conversion period of Dark voltages in the solid-state imaging device according to the first embodiment, and illustrates a connection state in a period III.
Figure 9:
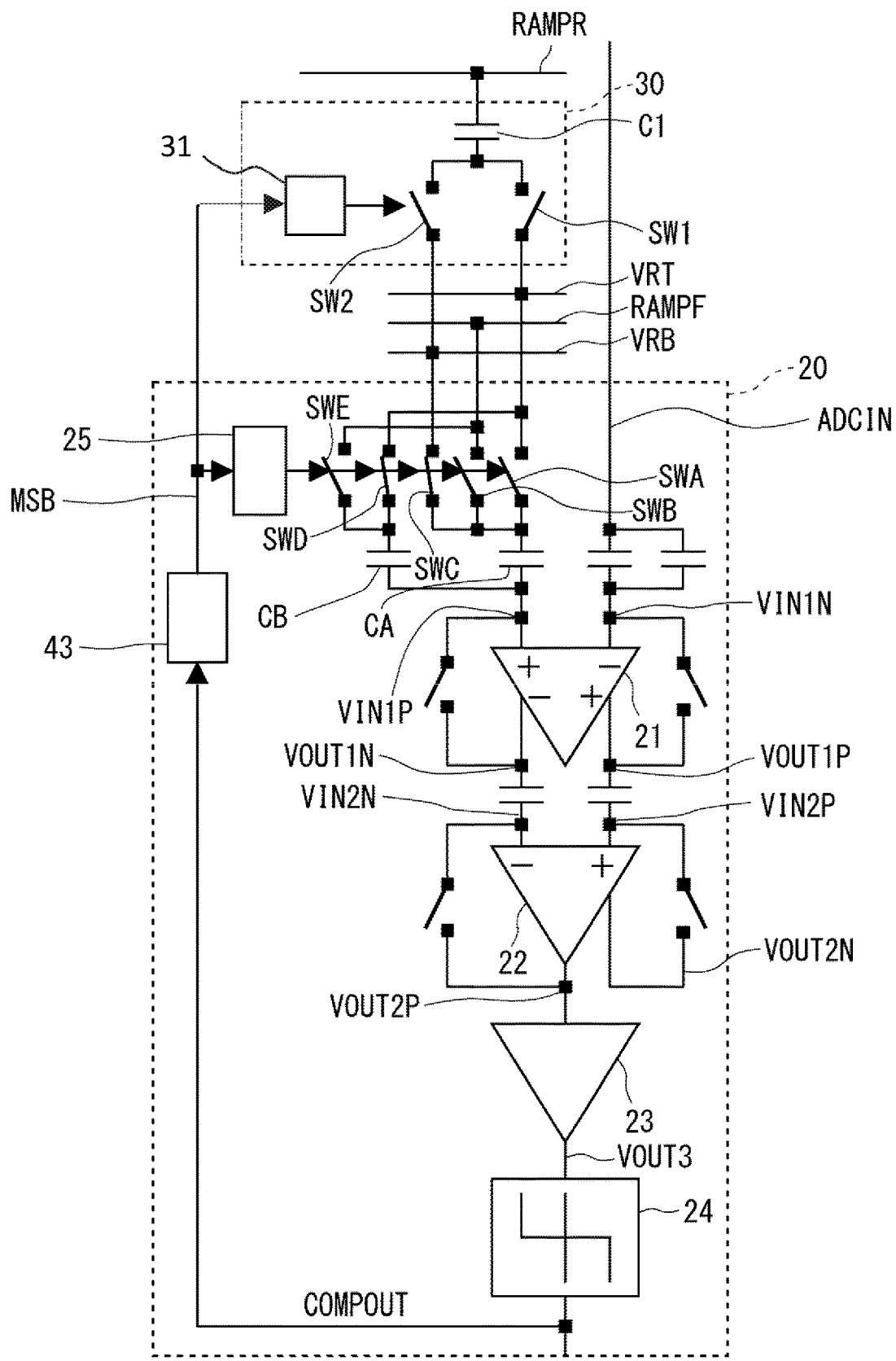
FIG. 9 illustrates an example of a connection of switches in a Coarse conversion period in the solid-state imaging device according to the first embodiment, and illustrates a connection state in a period VI.
Figure 10:
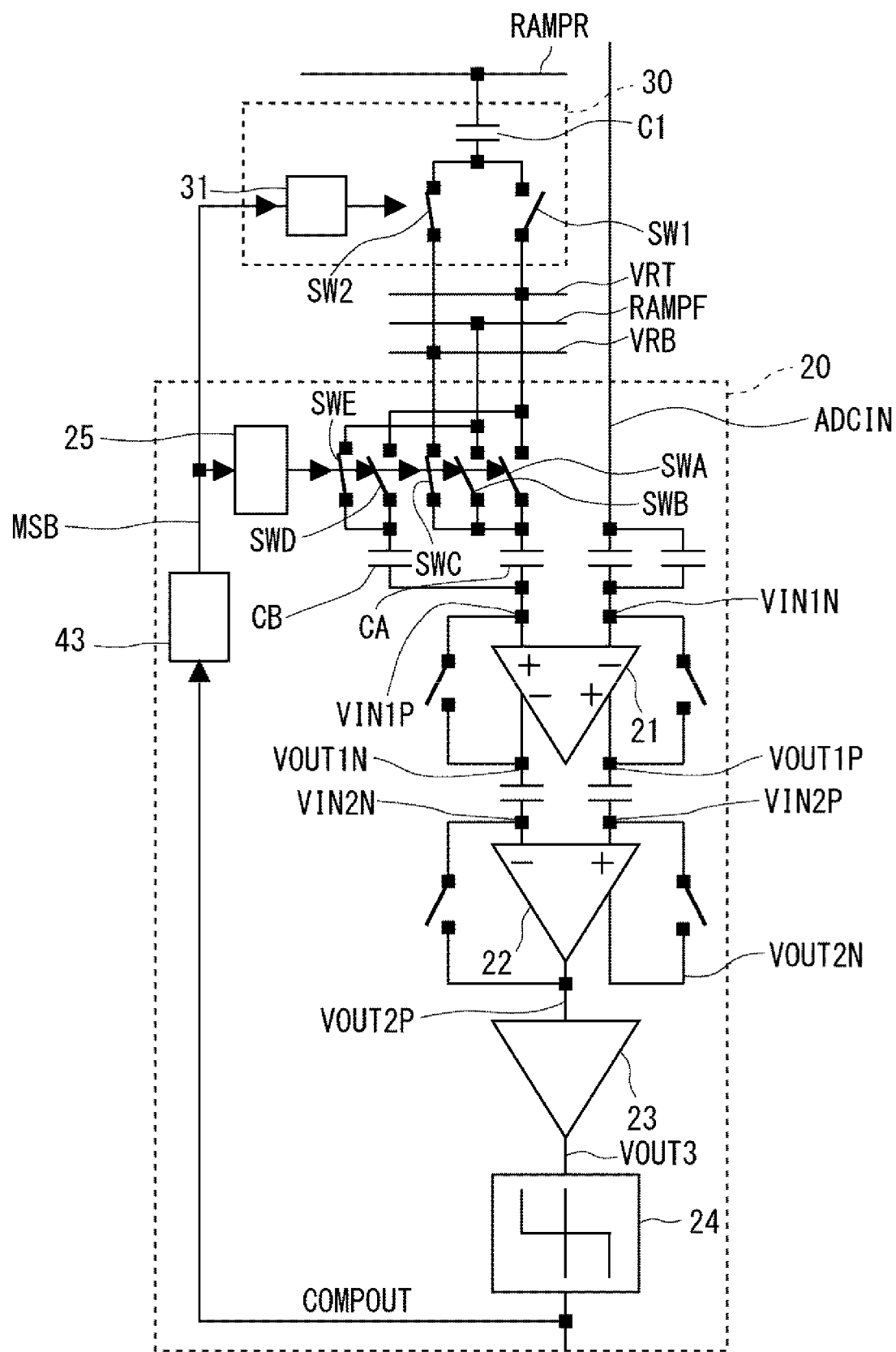
FIG. 10 illustrates an example of a connection of switches in a Fine conversion period when MSB is H-level in the solid-state imaging device according to some embodiments, and illustrates a connection state in a period VII.
Figure 11:
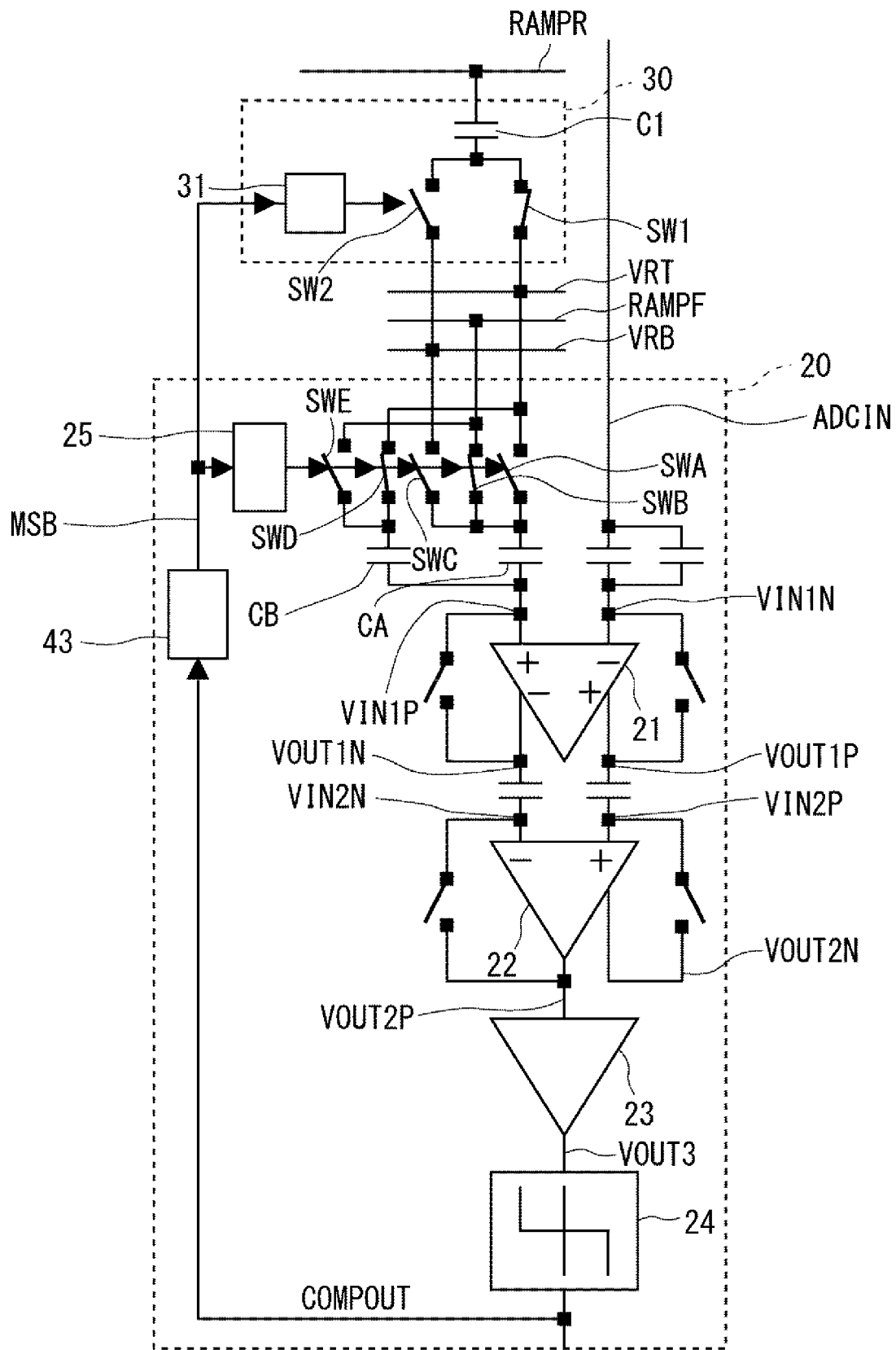
FIG. 11 illustrates an example of a connection of switches in a Fine conversion period when MSB is L-level in the solid-state imaging device according to some embodiments, and illustrates a connection state in a period VII.

Next, each of the periods I to VII are described. FIG. 7 illustrates an example a connection of switches in a reset period of comparator in the solid-state imaging device according to the first embodiment, and shows connection states in the period II. FIG. 8 illustrates an example of a connection of switches in a conversion period of Dark voltage in the solid-state imaging device in a period III according to the first embodiment, and connection states in the period III. FIG. 9 illustrates an example connection of switches in the Coarse conversion period in the solid-state imaging device according to the first embodiment, and shows connection states in the period VI. FIG. 10 illustrates an example connection of switches in the Fine conversion period when the MSB is at H-level in the solid-state imaging device according to the embodiments, and shows connection states in the period VII. FIG. 11 illustrates an example connection of switches in the Fine converting period when the MSB is at L-level in the solid-state imaging device according to the embodiments, and shows connection states in the period VII.

Period I is a reset period of the pixel PX. The AD converter does not need to operate in particular.

Period II is a reset period of the comparator 20 called auto-zero. FIG. 7 shows the connection in period II. As shown in FIG. 7, the switches inserted between the input/output terminals of the first amplifier 21 and the second amplifier 22 are closed. That is, the input terminal VIN1N of the first amplifier 21 and the output terminal VOUT1P are coupled in an on state, and the input terminal VIN1P of the first amplifier 21 and the output terminal VOUT1N are coupled in an on state. The input terminal VIN2P and the output terminal VOUT2N of the second amplifier 22 are coupled in an on state, and the input terminal VIN2N and the output terminal VOUT2P of the second amplifier 22 are coupled in an on state.

At the same time, Dark voltage from the pixels PX are applied to the luminance signal line ADCIN coupled to the comparator 20. The reference voltage side of the comparator 20 applies the reference voltage VRT to both the capacitors CA and CB. Specifically, the input terminal VIN1P is coupled to the VRT line in an on state via the capacitor CA and is coupled to the VRT line in an on state via the capacitor CB. After waiting for the settling of each contact voltage, the switches inserted between the input and output terminals of the first amplifier 21 and the second amplifier 22 are opened.

Period III is the Dark voltage conversion period. FIG. 8 shows the connection of period III. As shown in FIG. 8, the switch SWB is switched from the VRT line to the RAMPF signal line. A ramp signal RAMPF is provided which sweeps only the low intensity region in accordance with the input signal which is known voltage level. Then, the time until the output of the comparator 20 is inverted is measured. As a result, the Dark voltages are analog-to-digital converted.

In the period III, the input terminal VIN1P is coupled to the RAMPF signal line via the capacitor CA in an on state, and is coupled to the VRT line via the capacitor CB in an on state. As the ramp signal RAMPF sweeps, a ramp current flows to the VRT terminal side. In order to cancel this, the ramp current cancel circuit 30 connects the RAMPR signal line to the VRT line via the cancel capacitor C1 with an on-state. Specifically, the switch SWB, the switch SWD, and the cancel switch SW1 are switched to ON, and the switch SWA, the switch SWC, the switch SWE, and the cancel switch SW2 are switched to OFF. As a result, currents having equal absolute values and different polarities are supplied to the VRT line. In this manner, the ramp current can be canceled.

Period IV and Period V are periods waiting for the reading operation of signals from the respective pixels PX and the settling of the Signal voltage. The AD converter prepares for Signal voltage conversion such as returning a potential of the RAMPR to an original voltage.

Period VI is a period in which the Coarse conversion of the Signal voltages is performed. FIG. 9 shows a connection of the period VI. As shown in FIG. 9, the luminance signal voltage from the pixel PX is subsequently applied to the luminance signal line ADCIN. In the periods IV and V on the pixel PX-side, the Signal voltage is inputted instead of the Dark voltage. The input terminal VIN1P is coupled to the VRB line in an on-state via the capacitor CA, and is coupled to the VRT line via the capacitor CB.

Specifically, the switch SWC and the switch SWD are switched to the no state, and the switch SWA, the switch SWB, the switch SWE, the cancel switch SW1, and the cancel switch SW2 are switched to the off state. As a result, the reference voltages VRT and VRB are applied to the switch-side electrodes of the capacitors CA and CB, respectively. By this operation, the potential of the input terminal VIN1P is shifted by (VRT+VRB)/2 from the voltage at the time of auto-zero. On the other hand, Signal voltage is applied to the input terminal VIN1N. By judging the magnitude of these voltages, a voltage of the luminance signal line ADCIN is compared with (VRT+VRB)/2, and Coarse conversion is performed.

The Coarse conversion result is held in the output-MSB latch 41. The Coarse conversion result is further held at the MSB latch 43 as an output signal of the MSB latch 43 for subsequent Fine conversion. When the voltage of the luminance signal line ADCIN is higher than (VRT+VRB)/2, the output signal MSB is at the H level, and when the voltage is lower, the output signal MSB is at the L level.

Period VII is a period in which the Fine conversion of the Signal voltage is performed. The result of the Coarse conversion in the period VI is inputted to the switch-control circuit 25, Based on the result, the connection is determined as follows.

When the output signal MSB is at the H level, the connection shown in FIG. 10 is adopted. That is, the input terminal VIN1P is coupled to the VRB line via the capacitor CA in an on state, and is coupled to the RAMPF signal line via the capacitor CB in an on state. The ramp current cancel circuit 30 connects the RAMPR signal line to the VRB line via the cancel capacitor C1 in an on-state. Specifically, the switch SWC, the switch SWE, and the cancel switch SW2 are switched to the on-state. The switch SWA, the switch SWB, the switch SWD, and the cancel switch SW1 are switched to off.

The sweeping of the ramp signal RAMPF generates a ramp current in the VRB line. Therefore, in order to cancel this, at the side of the ramp current cancel circuit 30, the switch SW2 is switched on and the reverse ramp signal RAMPR is outputted to the VRB line via the cancel capacitor C1.

When the output signal MSB is at the L level, the connection shown in FIG. 11 is adopted. That is, the input terminal VIN1P is coupled to the RAMPF signal line via the capacitor CA in an on state, and is coupled to the VRT line via the capacitor CB in an on state. The ramp current cancel circuit 30 connects the RAMPR signal line to the VRT line via the cancel capacitor C1 in an on-state. Specifically, the switch SWB, the switch SWD, and the cancel switch SW1 are switched to the on state, and the switch SWA, the switch SWC, the switch SWE, and the cancel switch SW2 are switched to the off state.

As the ramp signal RAMPF sweeps, a ramp current is generated in the VRT line. Therefore, in order to cancel this, the switch SW1 is switched on at the side of the ramp current cancel circuit 30, and the reverse ramp signal RAMPR is outputted to the VRT line via the cancel capacitor C1.

After the above connections are performed, the ramp signal RAMPF and the inverse ramp signal RAMPR are swept. The counter circuit 14 starts the operation of the ramp signal RAMPF and the counter ramp signal RAMPR in synchronization with the sweep start. After the elapse of the time corresponding to the input signal, the output of the comparator 20 is inverted from the H level to the L level. At this time, the output of the counter circuit 14 is held by the counter latch 42, thereby AD-converting the Signal voltage.

Figure 12:
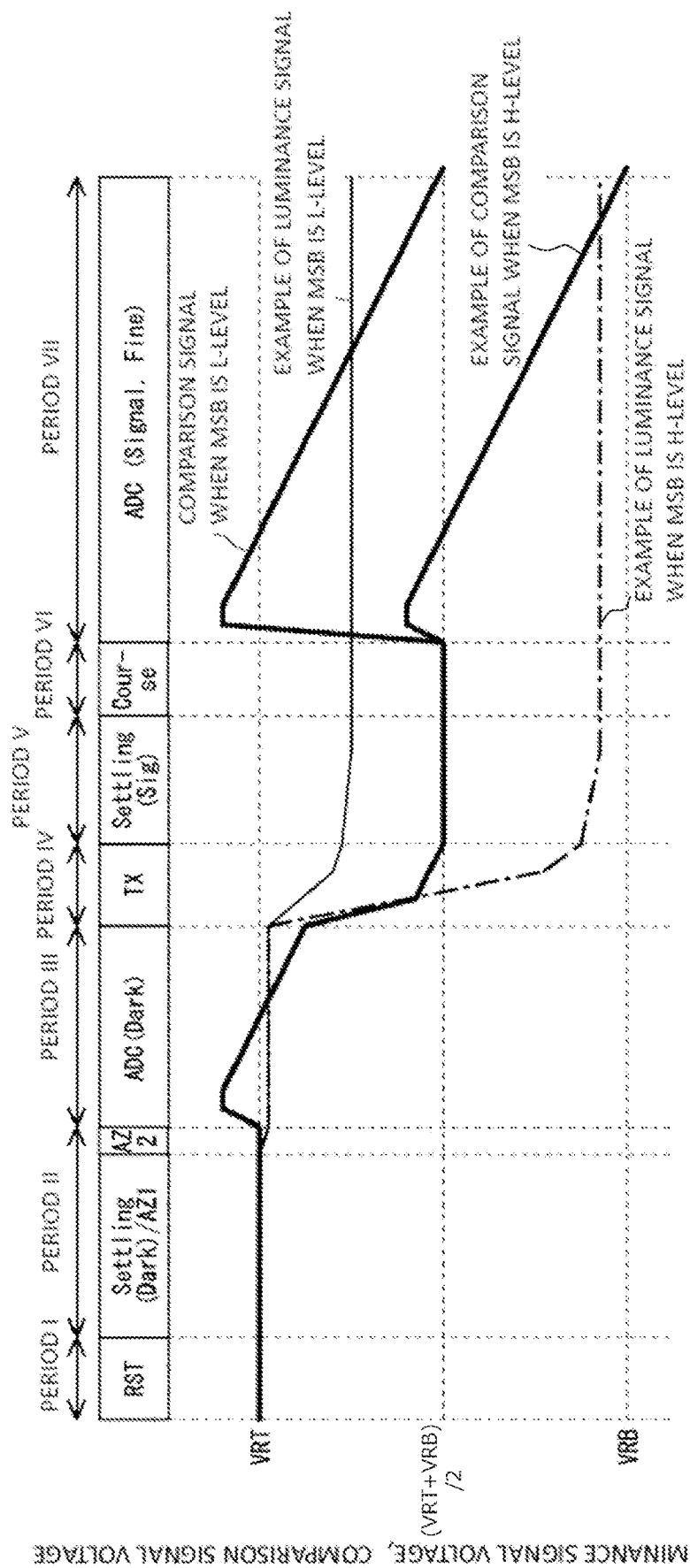
FIG. 12 illustrates an example of timing chart of operations of a luminance signal voltage and a comparative signal voltage in the solid-state imaging device according to the first embodiment.

FIG. 12 illustrates an example of a timing chart of operations of the luminance signal voltage and the comparative signal voltage in the solid-state imaging device according to the first embodiment. The actual luminance signal voltage and the comparative signal voltage have voltage levels differing from the reference voltages VRT and VRB and the ramp signal RAMPF by the auto-zero operation. However, in order to explain the reference voltages VRT and VRB and the ramp signals RAMPF, as shown in FIG. 12, the reference voltages VRT and VRB are represented at levels corresponding to the reference voltages VRT and VRB.

The signals latched by the output MSB latch 41 and the counter latch 42 are sent to a signal processing circuit 16 by a horizontal transfer circuit 15. In the signal processing circuit 16, the following calculation is performed in order to obtain the final AD conversion result.

A/D conversion result=Signal voltage conversion result+(full code/2)×(Coarse determination result)−Dark voltage conversion result The Coarse determination result is 1 when the MSB is at the H level, and is 0 when the MSB is at the L level. The full code is 2 to the 14th power 16384 in the case of a 14-bit AD converter.

Figure 13B:
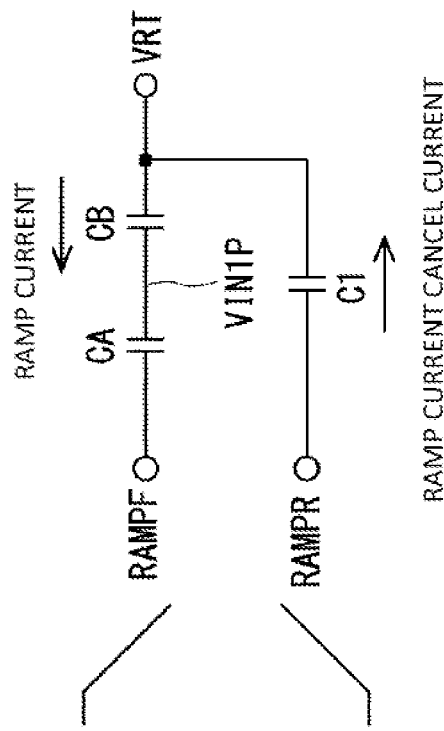
FIG. 13B illustrates an equivalent circuit focusing on an inverse ramp signal, a ramp signal, and a reference voltage VRT in the solid-state imaging device according to the first embodiment.
Figure 13A:
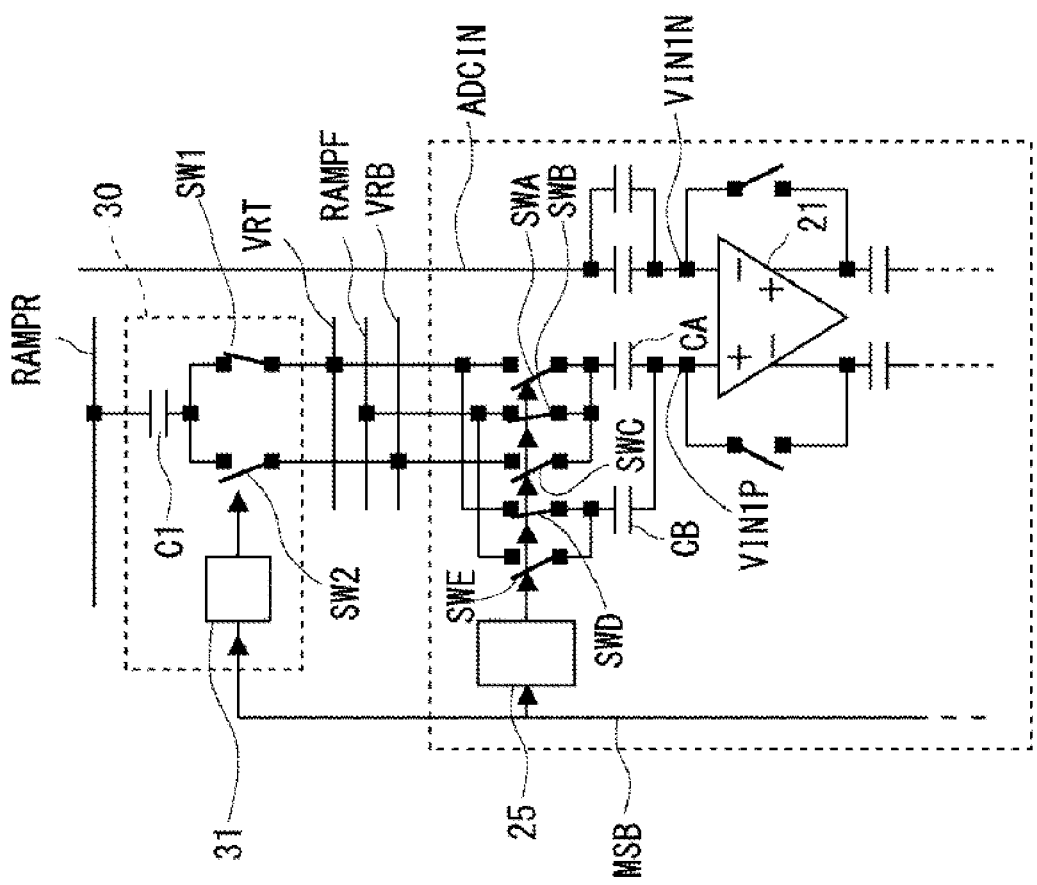
FIG. 13A illustrates a circuit diagram of a vicinity of a first amplifier when MSB is L-level at the time of Dark voltage conversion and at the time of Signal voltage conversion the solid-state imaging device according to the first embodiment.
Figure 15:
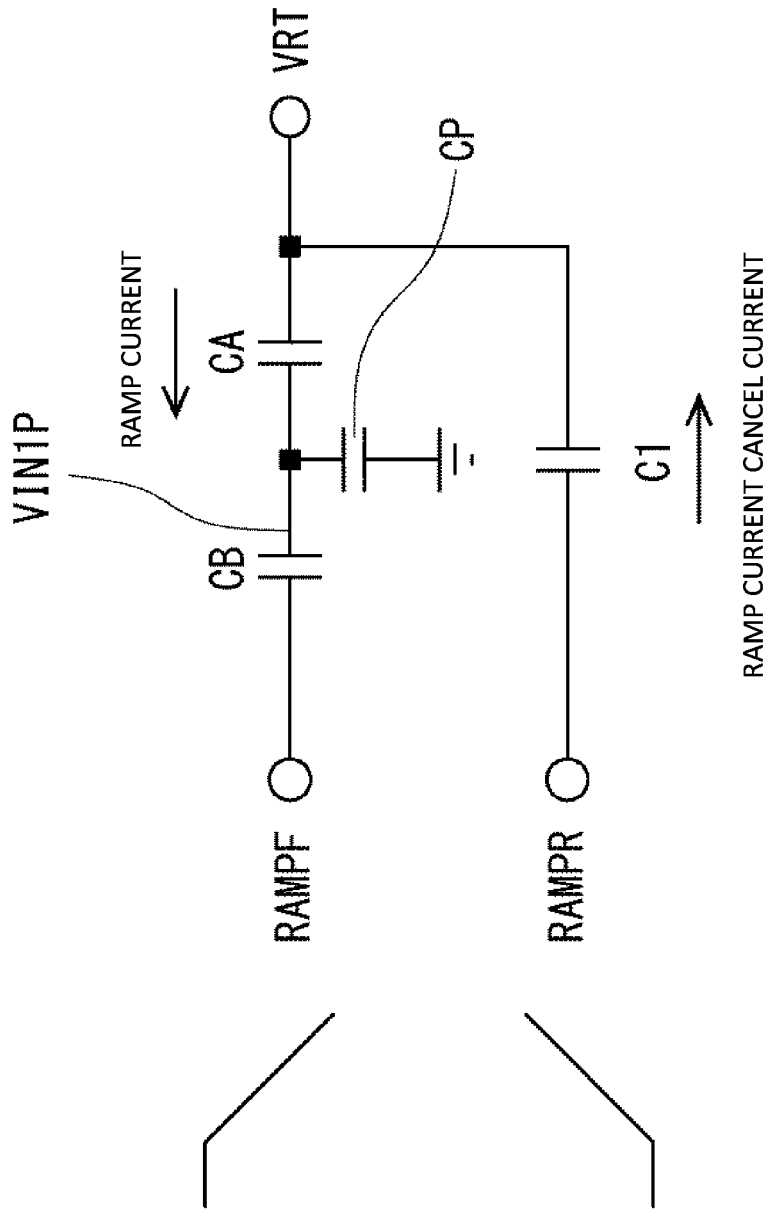
FIG. 15 illustrates an influence of a parasitic capacitor at an input terminal of the first amplifier on a capacitance of a cancel capacitor in the solid-state imaging device according some embodiments.

Next, effects of the present embodiment are described. FIG. 13A illustrates a circuit diagram of a vicinity of the first amplifier 21 *t* when at the time of Dark voltage conversion and when at the time of Signal voltage conversion and output signal MSB is at L-level in the solid-state imaging device according to the first embodiment. FIG. 13B illustrates an equivalent circuit focusing on the RAMPR signal line, the RAMPF signal line, and the VRT-line. FIG. 14A illustrates a circuit diagram of the vicinity of the first amplifier 21 when at the time of Signal voltage conversion and the output signal MSB is at the H-level in the solid-state imaging device according to the first embodiment. FIG. 14B illustrates an equivalent circuit focusing on the RAMPR signal line, the RAMPF signal line, and the VRB line. FIG. 15 illustrates a diagram for explaining the effect of the parasitic capacitor Cp of the input terminal VIN1P on the capacitance of the cancel capacitor C1 in the solid-state imaging device according to the embodiments.

As shown in FIG. 13, when at the time of Dark voltage conversion and when at the time of Signal voltage conversion and the output signal MSB is at L-level, a current (dV/dt)×(Ctot/4) flows through the VRT line if the parasitic capacitance of the input terminal VIN1P is ignored. By setting an absolute value of the slew rate of the inverse ramp signal RAMPR equal to that of the ramp signal RAMPF, the direction of the inverse ramp to opposite direction (−dV/dt) with that of the ramp signal RAMPF, and the capacitance value of the cancel capacitor C1 to (Ctot/4), the ramp current of the VRT line can be canceled.

Further, as shown in FIG. 14, when the output signal MSB is at the H level and when at the time of Signal voltage conversion, the ramp current can be cancelled by the reverse ramp signal RAMPR and the cancel capacitor C1.

As shown in FIG. 15, when the output signal MSB is at the L-level, the ramp current of the output signal MSB is as follows when the output signal MSB is at the capacitance value cp of the parasitic capacitor Cp of the input terminal VIN1P. (dV/dt)×(Ctot/2)^2/(Ctot+cp)

In this instance, the capacitance value of the cancel capacitor C1 needs to be (Ctot/2)^2/(Ctot+cp). For example, when cp=Ctot/2, the capacitance of C1 is optimal (Ctot/6).

In actual designing, the line capacitor of the input terminal VIN1P is calculated from the layout, and the capacitance of the cancel capacitor C1 is determined in consideration of the input capacitance of the first amplifier 21.

As described above, in the solid-state imaging device 1 of the present embodiment, the RAMPR line is coupled to the VRT line or the VRB line in the on-state when the ramp signal RAMPF is swept. As a result, the ramp current flowing into the VRT line and the VRB line can be cancelled, so that variations in the reference voltages VRT and VRB can be suppressed. Therefore, the performance of the solid-state imaging device 1 can be improved.

The ramp current cancel circuit 30 has a capacitor corresponding to the equivalent capacitance from the RAMPF line to the VRT line or the VRB line, and the ramp current can be cancelled by applying the reverse ramp signal to the VRT line or the VRB line. Therefore, the ramp current can be prevented from flowing out to the VRT line and the VRB line common to the ADC column. Therefore, there is no need to expand the line widths of the VRT line and the VRB line, and the solid-state imaging device can be miniaturized.

In the solid-state imaging device 1 of the present embodiment, a capacitor is inserted between the output terminal of the first amplifier 21 and the input terminal of the second amplifier 22. As a result, the power supply voltage (hereinafter referred to as DVDD) of the second amplifier 22 can be made to differ from the power supply voltage (hereinafter referred to as AVDD) of the first amplifier 21. For example, making the DVDD smaller than the AVDD (for example, 1.2V) can reduce the power consumption of the second amplifier 22. In addition, by separating the power supplies of the first amplifier 21 and the second amplifier 22, interference of power supply voltage noise due to a current change of the second amplifier 22 can be prevented.

Second Embodiment

Figure 16:
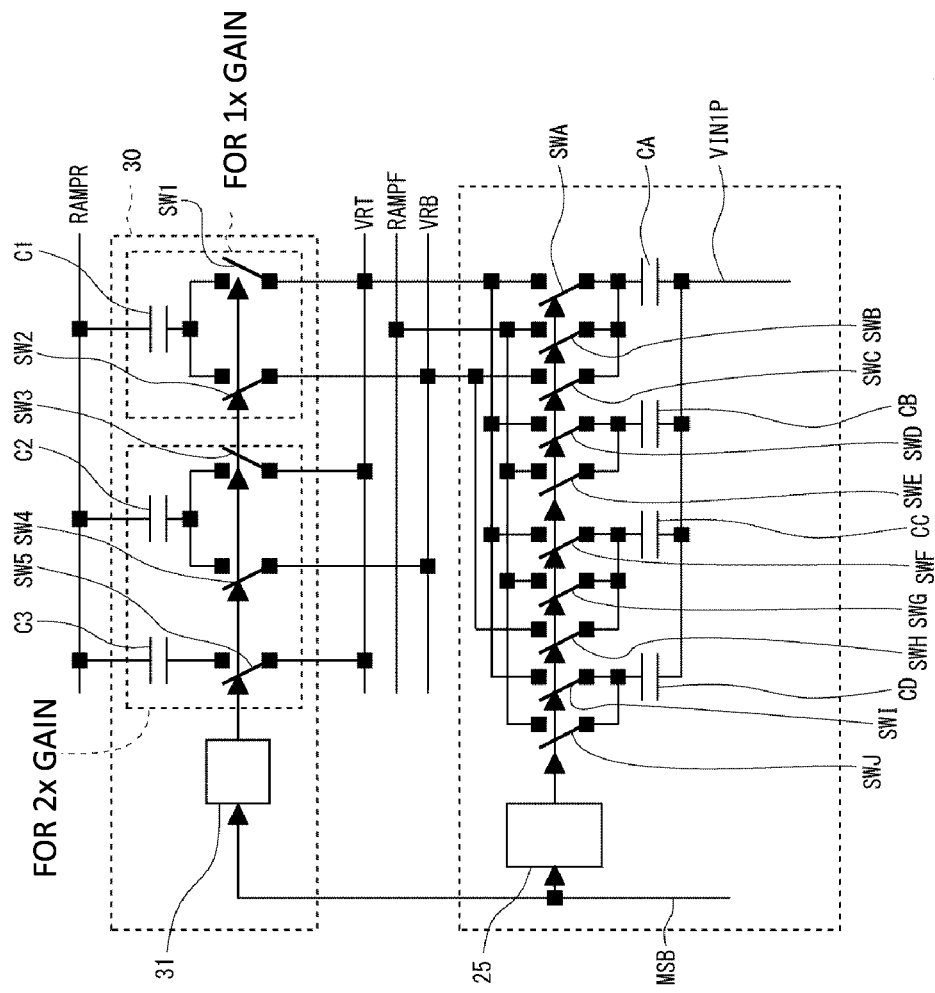
FIG. 16 illustrates an example of a capacitor, switches, and a ramp current cancel circuit coupled to the input terminal of the first amplifier in the solid-state imaging device according to a second embodiment.

Next, a solid-state imaging device according to a second embodiment are described. The solid-state imaging device of the present embodiment has a configuration in which the conversion gain is doubled inside the AD converter. FIG. 16 illustrates an example of capacitor, switches, and ramp current cancel circuit coupled to the input terminal VIN1P of the first amplifier 21 in the solid-state imaging device according to the second embodiment.

As shown in FIG. 16, the comparison-signal voltage is attenuated by ½ times by the capacitance division voltage using the capacitors CA, CB, CC, and CD coupled to the input terminal VIN1P of the first amplifier 21. This realizes doubling of the conversion gain. The configuration of the comparator 20 including the first amplifier 21, the second amplifier 22, the third amplifier 23, and the binarization circuit 24, and the ADCIN signal are the same as those of the first embodiment. The circuit on the side of input terminal VIN1P of the first amplifier 21 includes two sets of circuits similar to the circuit in the configuration of only one-time the input terminal according to the first embodiment.

More specifically, the comparator 20 has a plurality of sets, each of the sets including the switch SWA, the switch SWB, the switch SWC, the switch SWD, and the switch SWE. The ramp current cancel circuit 30 has a plurality of sets, each of the sets including the cancel capacitor C1, the cancel switch SW1, and the cancel switch SW2.

In this manner, the waveforms of the ramp signals RAMPF are attenuated by ½ by changing the connections on the VIN1P side of the first amplifier 21. Therefore, the luminance outputting signal of the luminance signal line ADCIN appears to be doubled in appearance. By attenuating the ramp signals RAMPF, the ramp current changes. Therefore, the ramp current cancel circuit 30 needs to be adapted to this. In the figure, the ramp current cancel circuit 31 switches between a circuit for 1× gain and for 2× gain, and operates according to the designation of the gain. Incidentally, the gain is not limited to 1× and 2×, but may be other multiples. The comparator 20 adjusts the number of capacitors coupled between the input terminal VIN1P, and the VRT line and the VRB line to adjust the magnitude of the reference voltage VRT and the reference voltage VRB input to the input terminal VIN1P.

Figure 17:
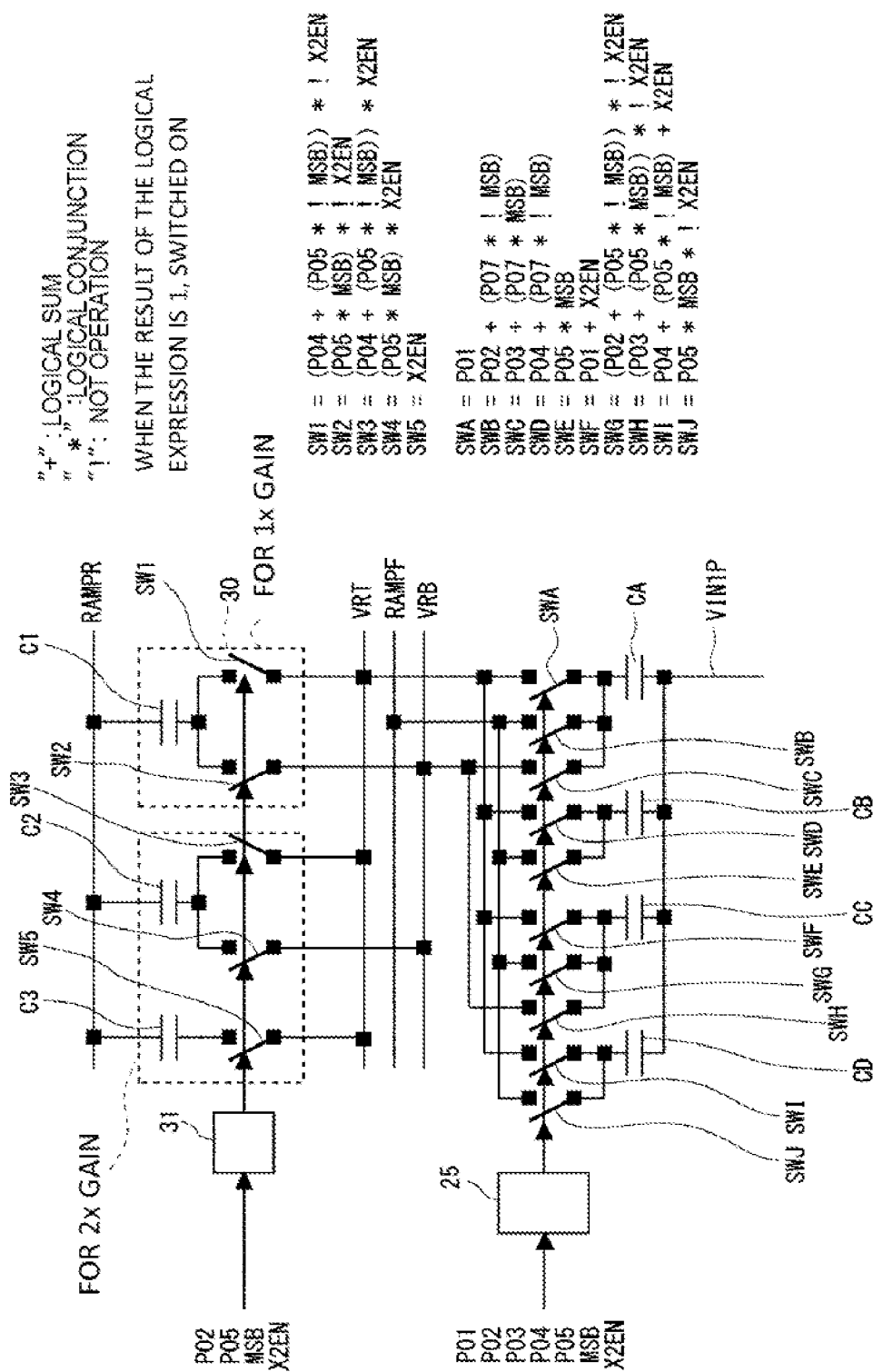
FIG. 17A illustrates a control of a switching control circuit and a ramp current cancel circuit in the solid-state imaging device according to the second embodiment.
FIG. 17B illustrates an example of control signals according to the second embodiment.

FIG. 17A illustrates an example of a control of the switching control circuit and the ramp current cancel circuit in the solid-state imaging device according to the second embodiment. FIG. 17B illustrates an example of control signals. In FIG. 17A, the capacitors CA, CB, CC, and CD have equal value (Ctot/4). The pulses P01, P02, P03, P04, P05, X2EN, and MSB are inputted to the switch control circuit 25. The gain setting X2EN is a control signal that becomes H-level when the conversion gain is doubled. P01, P02, P03, P04, P05, and X2EN are generated as control signals in the control circuit 10 of FIG. 1, and are inputted to the AD converter. The switches SWA to SWJ are switched by these signals. FIG. 17B shows the functions necessary for this circuit by a logical expression.

The cancel capacitor C1 and the cancel switches SW1 and SW2 in the ramp current cancel circuit 30 is used when the gain is 1 as well as the first embodiment. The cancel capacitors C2 and C3 and the cancel switches SW3, SW4, SW5 are used when the gain is doubled.

When the conversion gain is 1, and when the parasitic capacitor of the terminal VIN1P is ignored, the capacitance of the cancel capacitor C1 is Ctot/4 as well as the first embodiment. When the conversion gain is doubled, the capacitors CC and CD are always coupled to the VRT line, and the comparison signal is attenuated by ½. At this time, a cancel capacitor C3 is used as a capacitor for canceling the ramp current flowing through the capacitors CC and CD. One of the capacitors CA and CB is coupled to the ramp signal RAMPF, and the other of the capacitors CA and CB is coupled to the VRT line or the VRB line in accordance with the output signal MSB.

A cancel capacitor C2 cancels the ramp current flowing through the capacitor CA or the capacitor CB. Ignoring the parasitic capacitor at the input terminal VIN1P, the capacitance values of the cancel capacitors C2 and C3 are (Ctot/8) and (Ctot/6), respectively.

Figure 18:
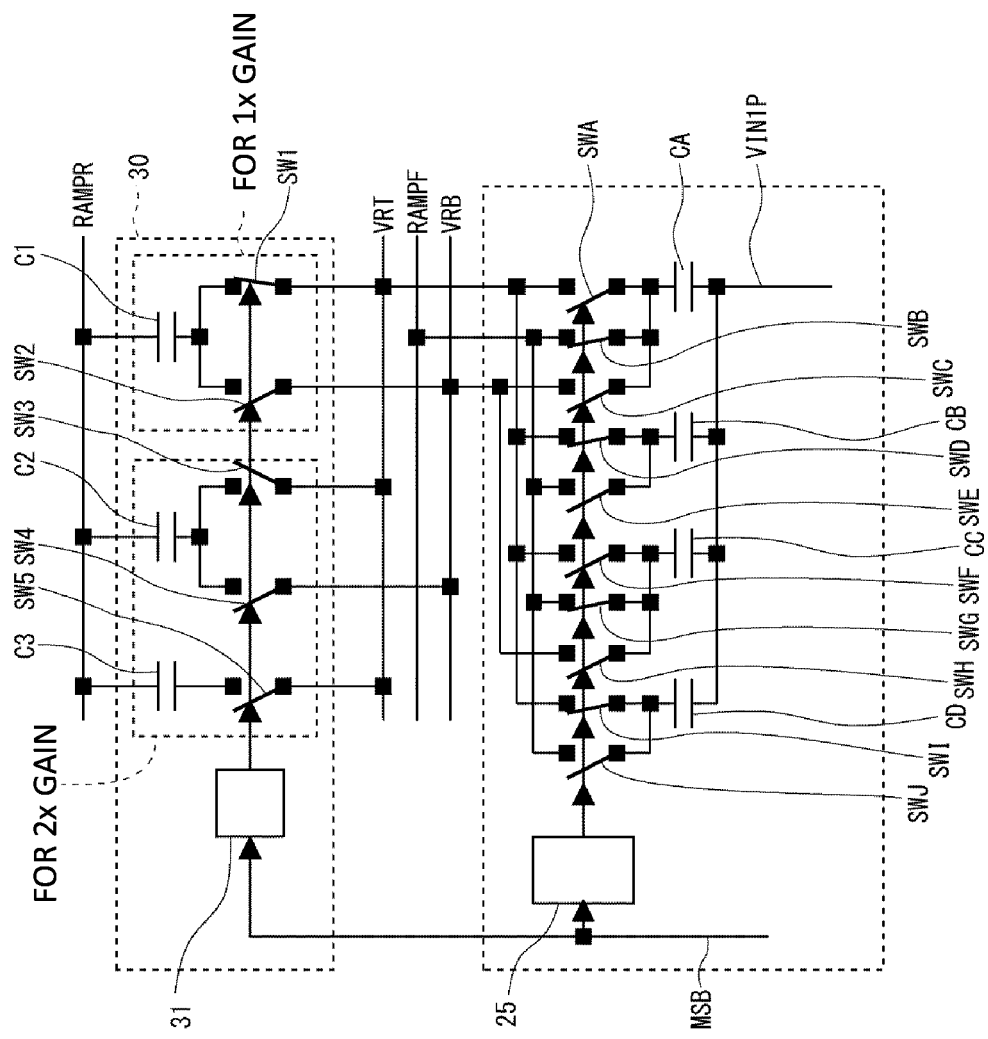
FIG. 18 illustrates a connection of switches of a switch control circuit and a ramp current cancel circuit at the time of Dark conversion when the conversion gain is 1 time in the solid-state imaging device according to the second embodiment.
Figure 19:
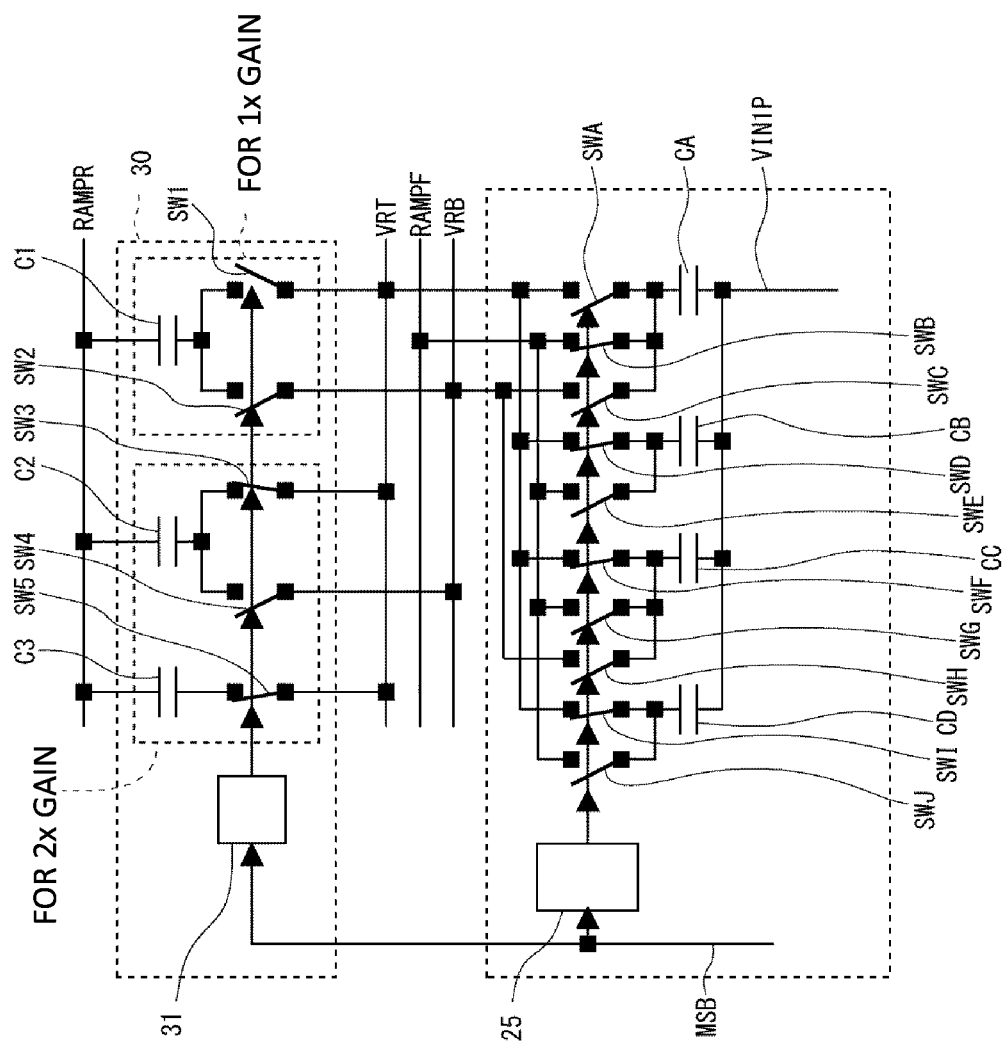
FIG. 19 illustrates a connection of switches of a switch control circuit and a ramp current cancel circuit at the time of Dark conversion when the conversion gain is doubled in the solid-state imaging device according to the second embodiment.

Next, an example of the present embodiment having a gain in the AD converter is described. Since the movements of the respective operation periods are the same as those of the configuration having no internal gain, only the Dark voltage-conversion period will be described here. FIGS. 18 and 19 show the operations of the AD converter having the internal gain using the present embodiment.

FIG. 18 illustrates a connection of switches of a switch control circuit and a ramp current cancel circuit at the time of Dark conversion when the conversion gain is 1 time in the solid-state imaging device according to the second embodiment. As shown in FIG. 18, in the Dark voltage conversion period when the internal gain of the AD converter is 1, the switches SWB and SWG are switched on at the side of the input terminal VIN1P of the first amplifier 21 of the comparator 20, and the ramp signal RAMPF is applied to the capacitors CA and CC. The switches SWD and SWI are switched on, and the reference voltage VRT is applied to the capacitors CB and CD. The VRT line and the RAMPF signal line are coupled to each other through the capacitors CA to CD. Therefore, a ramp current flows into the VRT line. In order to cancel this, in the ramp current cancel circuit 30, the VRT line is coupled to the cancel capacitor C1, which is a circuit for 1 gain, via the cancel switch SW1. That is, the cancel switch SW1 is switched on.

FIG. 19 illustrates a connection of switches of a switch control circuit and a ramp current cancel circuit at the time of Dark conversion when the conversion gain is doubled in the solid-state imaging device according to the second embodiment. As shown in FIG. 19, in order to double the internal gain of the AD converter, the comparison signal voltage is attenuated by ½ by the capacitor voltage division. Therefore, the capacitors CC and CD are coupled to the VRT line. The switches SWA to SWE and the circuits on the capacitors CA and CB side are coupled as same connection as the circuit for 1 gain. That is, the capacitor CA is coupled to the RAMPF signal line via the switch SWB. The capacitor CB is coupled to the VRT line through the switch SWD. Since the capacitors CC and CD are coupled to the VRT line, the comparison signal voltage generated at the input terminal VIN1P is attenuated by ½ in comparison with the case of FIG. 18.

The capacitor CA and the capacitors CB, CC, and CD are coupled in series, whereby the RAMPF signal line is coupled to the VRT line. Therefore, a ramp current is generated. In order to cancel this, an inverse ramp current is generated by a circuit for 2× gain in the ramp current cancel circuit 30. Inverse ramp signals RAMPR are applied to the cancel capacitors C2 and C3 via the cancel switches SW3 and SW5 to generate a cancel ramp current.

Third Embodiment

Next, a solid-state imaging device according to the third embodiment is described. In the solid-state imaging device of the present embodiment, the second amplifier, the third amplifier, and the binarization circuit are driven by a second power supply voltage (hereinafter referred to as DVDD) which is smaller than the power supply voltage (hereinafter referred to as AVDD) of the first amplifier. This makes it possible to reduce power consumption as compared with the comparator of the single power source disclosed in Japanese Patent No. 4661876

Figure 20:
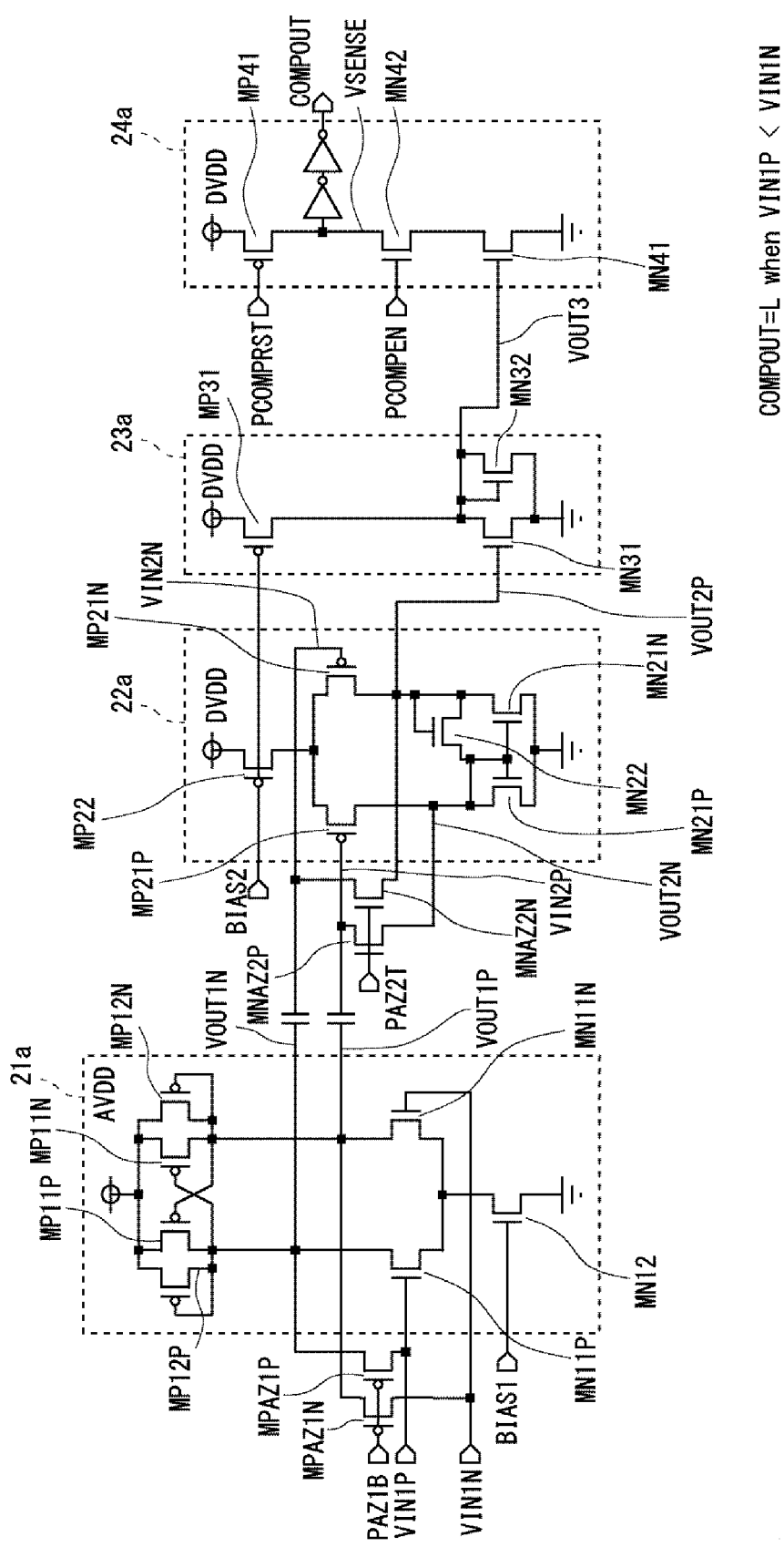
FIG. 20 illustrates an example of a converter in the solid-state imaging device according to a third embodiment.
Figure 21:
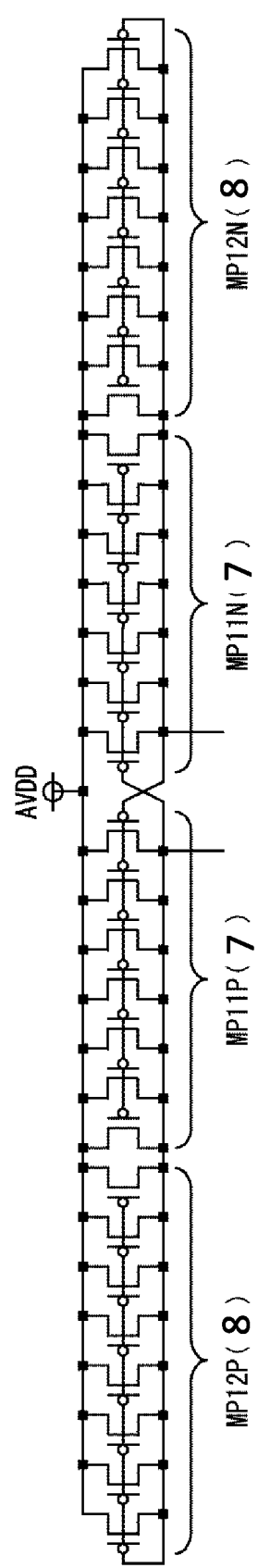
FIG. 21 illustrates an example of a load circuit of a converter in the solid-state imaging device according to the third embodiment.

FIG. 20 illustrates an example of AD converter in the solid-state imaging device according to the third embodiment. FIG. 21 illustrates an example of load circuit of converter in the solid-state imaging device according to the third embodiment. As shown in FIG. 20, the transistor MP11P, MP11N, MP12P, MP12N, MN11N, MN11P, MN12 constitutes a first amplifier 21a. Thus, the first amplifier 21a amplifies a differential input of the input terminals VIN1P and VIN1N. The transistor MP11P, MP11N, MP12P, MP12N is a load circuit. FIG. 21 shows the actual configuration of the load circuit. That is, the transistors MP12P and MP12N include eight transistors, and the transistors MP11P and MP11N include seven transistors. Since the inverted outputs of the transistors MP11P, MP11N are coupled to the gate electrodes, the transistors MP11P and MP11N function as a negative resistor, and the gain of the first amplifier 21a is increased by increasing the load resistance.

The MPAZ1P, MPAZ1N functions as an auto-zero switch and operates according to the timing chart of FIG. 6. When PAZ1B is at L-level, the MPAZ1P and MPAZ1N are switched on and short-circuits the inputs and their respective inverted outputs. As a result, an auto-zero voltage is generated. When the PAZ1B switches from the L level to the H level, the signals on the capacitors coupled to the VIN1P, VIN1N are sampled.

The transistor MP21P, MP21N, MP22, MN21P, MN21N, MN22 constitutes a second amplifier 22a. The second amplifier 22a functions as a single-ended amplifier for amplifying the differential input voltage. The transistor MN22 is switched on and clips the output of the second amplifier 22a when the voltage of the VOUT2P becomes larger than the voltage of the VOUT2N by more than the threshold voltage. This prevents a change in the current of the second amplifier 22a before and after the output inversion of the second amplifier 22a. Therefore, it is possible to prevent from different condition of the analog power supply.

The MNAZ2P and the MNAZ2N function as an auto-zero switch and operate according to the timing chart of FIG. 6. When PAZ2T is at H-level, the MNAZ2P and the MNAZ2N becames on and generates the auto-zero voltage. When the PAZ2T is switched from the H level to the L level, signals in the capacitor between the first amplifier 21a and the second amplifier 22a are sampled. Thus, it is possible to cancel the offset error of the first amplifier 21a.

The transistor MP31, MN31, MN32 constitutes a third amplifier 23a. The transistors MN31 and MP31 are grounded-source amplifier circuits that receive the gate electrodes of the transistors MN31. The transistor MP31 is a load transistor that operates as a constant current source.

In the Fine conversion, the input voltage of third amplifier 23a in the initial-state is H-level. Therefore, the output VOUT3 of the third amplifier 23a is L-level. At this time, the drain current of the transistor MP31 flows to the ground through the drain-source of the transistor MN31.

When the voltage of the input terminal VIN1P becomes smaller than the voltage of the input terminal VIN1N, the output are inverted. At this time, the transistor MN31 is switched off, and the drain current of the transistor MP31 flows through the MN32. This prevents a change in the current of the second amplifier 22a before and after the output inversion of the third amplifier 23a. Therefore, it is possible to prevent from different condition of the analog power supply.

The transistors MP41, MN41, MN42 and the inverters constitute the binarization circuit 24a. The transistors MP41, MN42 is controlled by the control signals PCOMPREST, PCOMPEN in FIG. 6. When the PCOMPRST is L-level, the transistor MP41 is switched on. As a result, VSENSE becomes H-level. When the PCOMPRST becomes H-level, the VSENSE maintains the H level by holding the voltage in a parasitic capacitor such as a wire capacitor.

In the FINE conversion, the binarization circuit 24a is enabled when the PCOMPEN is H-level. When the input voltage of the binarization circuit 24 exceeds the threshold voltage of the MN41, the transistor MN41 is switched on, and the VSENSE of the binarization circuit 24 is pulled down to L-level. Therefore, the COMPOUT changes to L-level, thereby confirming the output.

Figure 22:
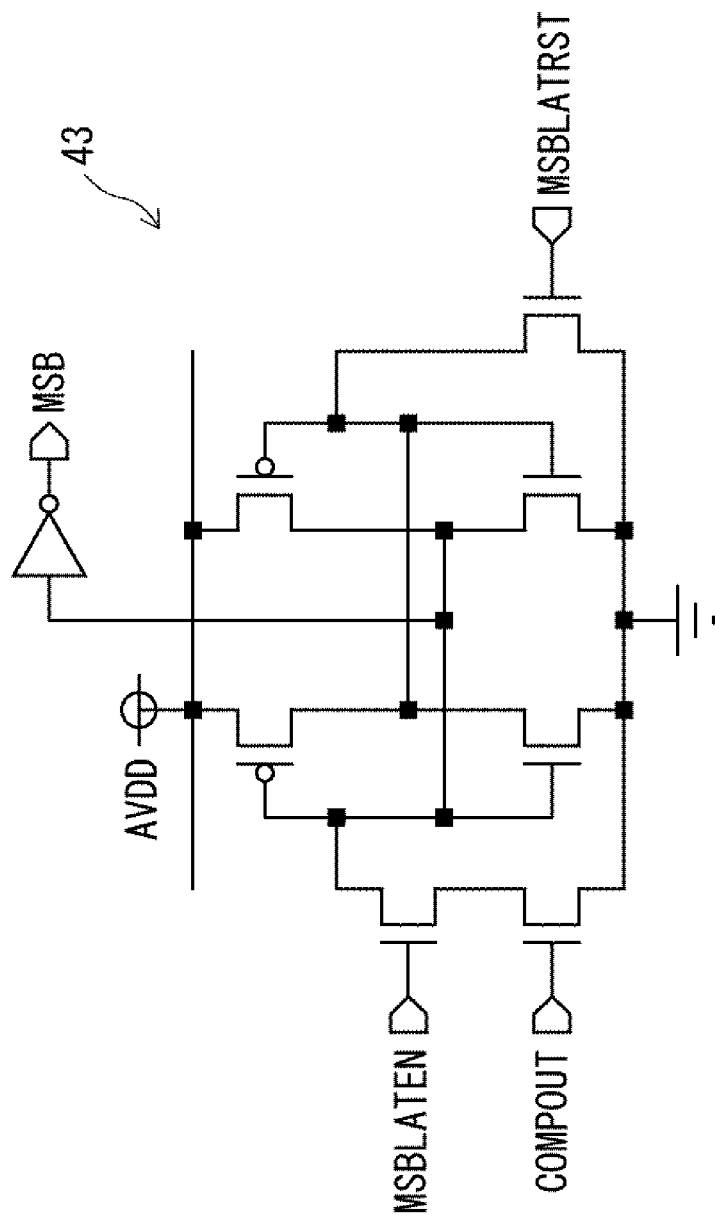
FIG. 22 illustrates a latching circuit of MSB that hold Coarse conversion results in the solid-state imaging device according to the third embodiment.

The COMPOUT outputs H level/L level with DVDD amplitudes. FIG. 22 shows a circuit diagram of a MSB latch circuit for holding the Coarse conversion result in the solid-state imaging device according to the third embodiment. The Course conversion result COMPOUT is inputted to the MSB-latch 43 shown in FIG. 22. The MSB latch 43 also functions as a level shifter, and the output MSB of the MSB latch 43 outputs an H level/L level with a AVDD amplitude.

Fourth Embodiment

Figure 23:
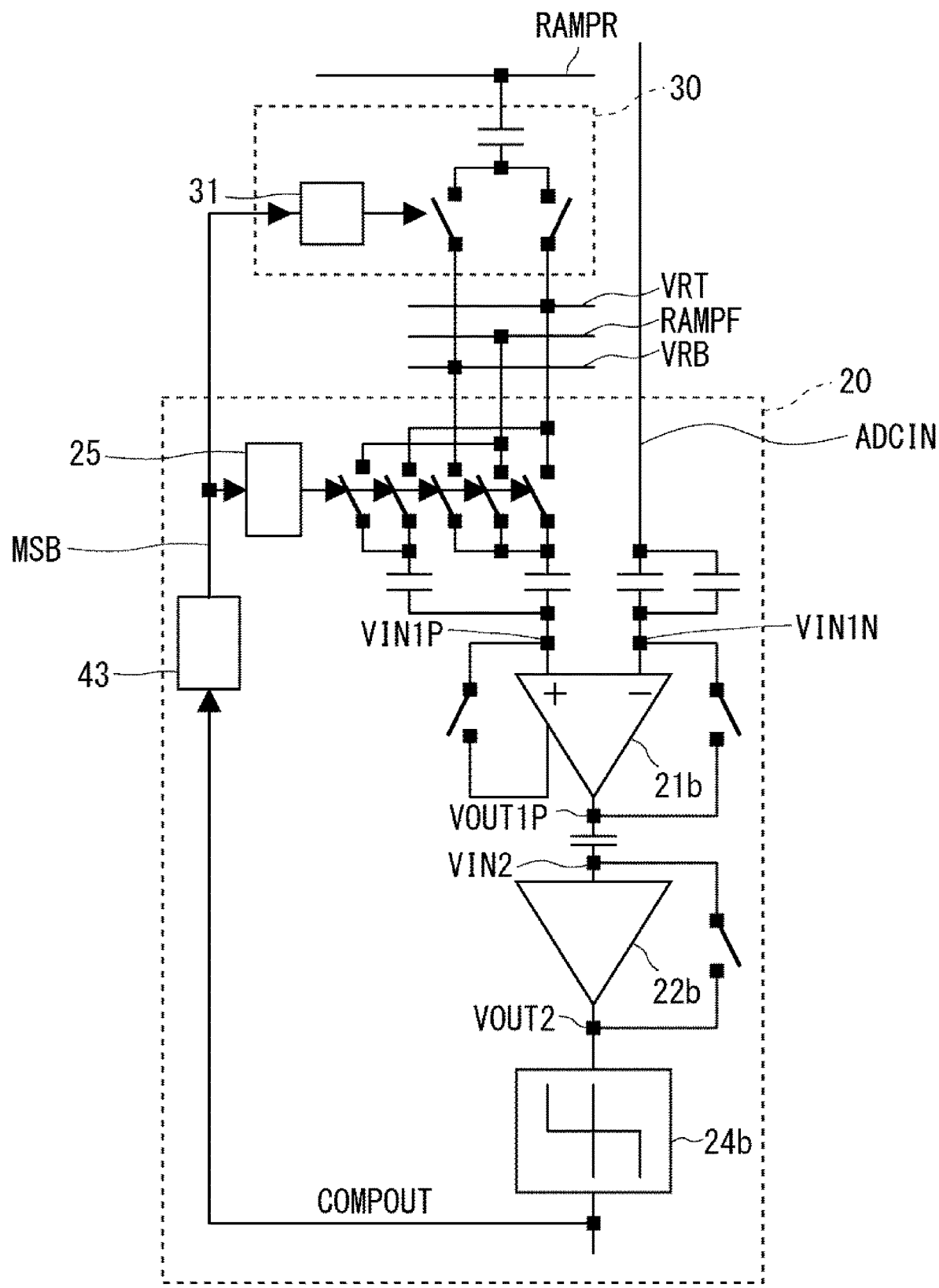
FIG. 23 illustrates an example of a converter in the solid-state imaging device according to a fourth embodiment.
Figure 24:
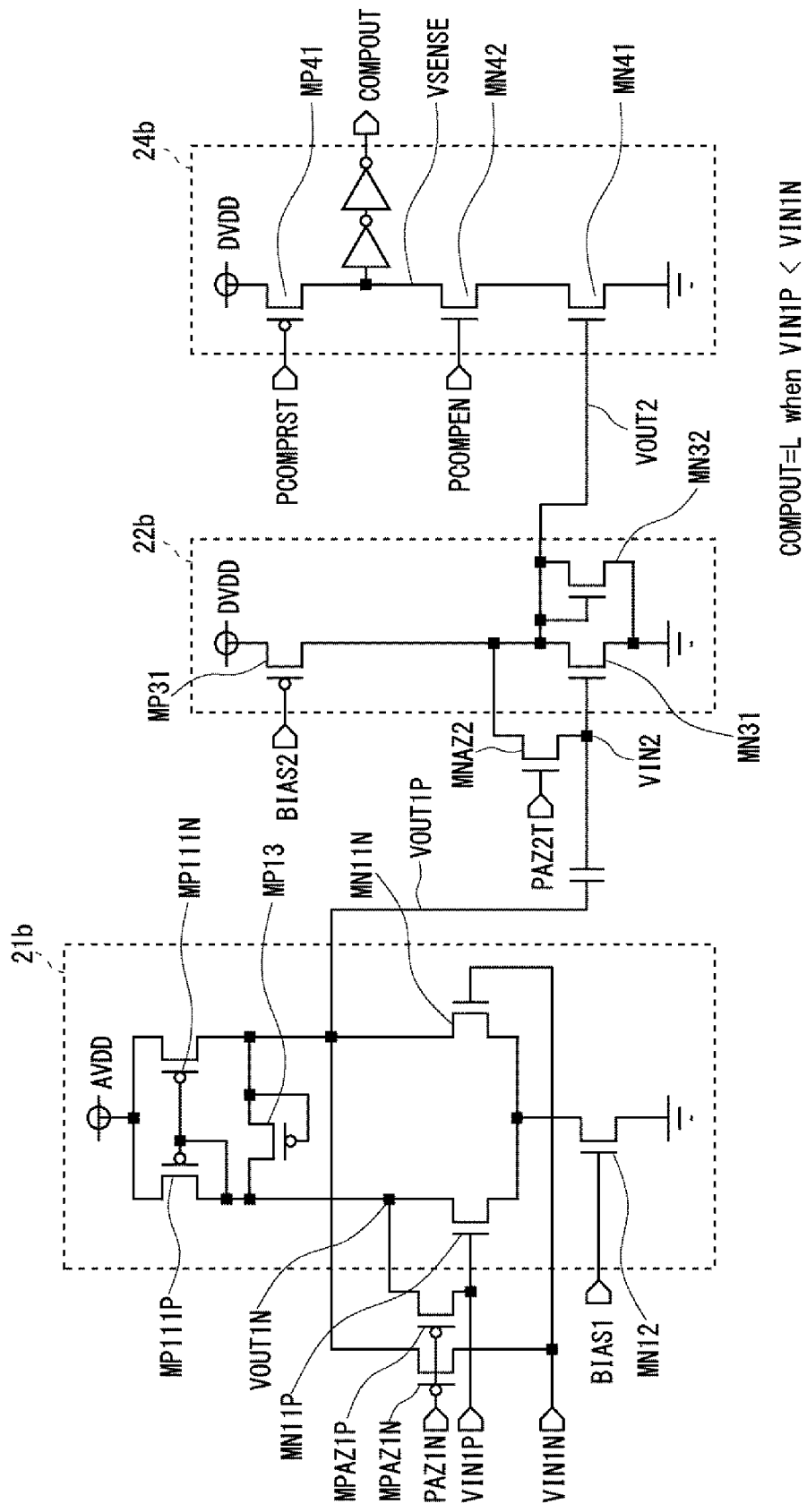
FIG. 24 illustrates an example of a first amplifier, a second amplifier, and a binarization circuit in the solid-state imaging device according to the fourth embodiment.

Next, a solid-state imaging device according to the fourth embodiment is described. FIG. 23 illustrates an example of a converter in the solid-state imaging device according to a fourth embodiment. FIG. 24 illustrates an example of a first amplifier, a second amplifier, and a binarization circuit in the solid-state imaging device according to the fourth embodiment. The AD converter of the present embodiment have a two-stage preamplifier in the binarization circuit.

As shown in FIGS. 23 and 24, the first amplifier 21b operates with AVDD as a power supply voltage, and the second amplifier 22b and the binarization circuit 24b operate with DVDD as a power supply voltage. The two-stage preamplifier can reduce a power consumption and chip area.

The transistor MP111P, MP111N, MP13, MN11P, MN11N, MN12 constitutes the first amplifier 21b, and functions as a single-ended amplifier for amplifying differential input voltages of the first amplifier 21b. The transistor MP13 is switched on when the VOUT1P is lower than the VOUT1N by more than the threshold voltage, and clips the output of the first amplifier 21b. This prevents a change in the current of the first amplifier 21b before and after the output inversion of the first amplifier 21b. Therefore, it is possible to prevent from different condition of the analog power supply.

Further, by clipping the output voltage, the input voltage VIN2 of the second amplifier 22b becomes less than the ground voltage. Therefore, it is possible to prevent forward-direction of the PN junction of a source electrode of the MNAZ2 which is so-called charge-leakage is prevented. Hereinafter, the second amplifier 22b and the binarization circuit 24b are the same as the third amplifier 23a and the binarization circuit 24a of the third embodiment.

Although each embodiment has been described above, the present invention is not limited to the above-described configuration, and can be changed within a range not deviating from the technical idea. Also, a combination of elements in the first to fourth embodiments is also within the concept of the technical idea. For example, the following solid-state imaging device is also within the technical concept of the first to fourth embodiments.

(Additional Statement 1)

A solid-state imaging device comprising:
a pixel configured to output a luminance signal voltage corresponding to an incident light amount to a luminance signal line;
a reference voltage generation circuit for outputting a reference voltage to a reference voltage line, and
an AD converter for AD-converting the luminance signal voltage,
wherein the AD converter includes a first amplifier, a second amplifier, and a binarization circuit, and
wherein an output terminal of the first amplifier is coupled to an input terminal of the second amplifier via a first capacitor.

(Additional Statement 2)

The solid-state imaging device according to additional statement 1, wherein a third amplifier is further coupled between the second amplifier and the binarization circuit.

What is claimed is:
1. A solid-state imaging device comprising:
a pixel configured to output a luminance signal voltage corresponding to an incident light amount to a luminance signal line;
a reference voltage generating circuit configured to output
a first reference voltage to a first reference voltage line,
a second reference voltage to a second reference voltage line, a ramp signal having a predetermined slew rate to a ramp signal line, and an inverse ramp signal having a different direction with the ramp signal to an inverse ramp signal line; and an AD converter configured to preform AD conversion of the luminance signal voltage;

wherein the AD converter comprises:
   a comparator comprising an amplifier, the amplifier comprises a first input terminal coupled to the luminance signal line, and a second input terminal configured to connect or disconnect to the first reference voltage line, the second reference voltage line, and the ramp signal line respectively; and
   a ramp current cancel circuit configured to connect or disconnect the inverse ramp signal line to the first reference voltage line and second reference voltage line respectively.

2. The solid-state imaging device according to claim 1, wherein the second input terminal is configured to connect or disconnect to the first reference voltage line, the second reference voltage line, and the ramp signal line respectively via a first capacitor, and configured to connect or disconnect to the first reference voltage line and the ramp signal line respectively via a second capacitor.

3. A solid-state imaging device comprising:
a pixel configured to output a luminance signal voltage corresponding to an incident light amount to a luminance signal line;
a reference voltage generating circuit configured to output a first reference voltage to a first reference voltage line, a second reference voltage to a second reference voltage line, a ramp signal having a predetermined slew rate to a ramp signal line, and an inverse ramp signal having a different direction with the ramp signal to an inverse ramp signal line; and
an AD converter configured to preform AD conversion of the luminance signal voltage;
wherein the AD converter comprises:
   a comparator comprising an amplifier, the amplifier comprises a first input terminal coupled to the luminance signal line, and a second input terminal configured to connect or disconnect to the first reference voltage line, the second reference voltage line, and the ramp signal line respectively; and
   a ramp current cancel circuit configured to connect or disconnect the inverse ramp signal line to the first reference voltage line and second reference voltage line respectively,
wherein the second input terminal is configured to connect or disconnect to the first reference voltage line, the second reference voltage line, and the ramp signal line respectively via a first capacitor, and configured to connect or disconnect to the first reference voltage line and the ramp signal line respectively via a second capacitor, and
wherein the ramp current cancel circuit comprises a cancel capacitor, and configured to connect or disconnect the inverse ramp signal line to the first reference voltage line and the second reference voltage line via a cancel capacitor.

4. The solid-state imaging device according to claim 3, wherein the pixel comprises a photodiode, and a dark voltage being voltage before transferring a charge from photodiode is outputted to the luminance signal line as the luminance signal voltage.

5. The solid-state imaging device according to claim 4, wherein the first input terminal of the amplifier and a first output terminal of the amplifier are configured to connect each other, and the second input terminal of the amplifier and a second output terminal of the amplifier are configured to connect each other, and
the second input terminal is configured to connect to the first reference voltage line via the first capacitor and configured to connect to the first reference voltage via the second capacitor.

6. The solid-state imaging device according to claim 4, wherein the second input terminal is configured to connect to the ramp signal line via the first capacitor, and configured to connect to the first reference voltage line via the second capacitor, and
wherein the ramp current cancel circuit is configured to connect the inverse ramp signal line to the first reference voltage line via the cancel capacitor.

7. The solid-state imaging device according to claim 3, wherein the pixel comprises a photodiode, and a signal voltage, the signal voltage being generated by transferring charges from the photodiode by photoelectrically conversion, is outputted to the luminance signal line as the luminance signal voltage.

8. The solid-state imaging device according to claim 7, wherein the second input terminal is configured to connect to the second reference voltage line via the first capacitor and configured to connect to the first reference voltage line via the second capacitor.

9. The solid-state imaging device according to claim 7, wherein
when the luminance signal voltage is larger than ½ of a sum of the first reference voltage and the second reference voltage, the second input terminal is configured to connect to the second reference voltage line via the first capacitor, and configured to connect to the ramp signal line via the second capacitor, and
the ramp current cancel circuit is configured to connect the inverse ramp signal line to the second reference voltage line via the cancel capacitor.

10. The solid-state imaging device according to claim 7, wherein
when the luminance signal voltage is smaller than ½ of a sum of the first reference voltage and the second reference voltage, the second input terminal is configured to connect to the ramp signal line via the first capacitor, and configured to connect to the first reference voltage line via the second capacitor, and
the ramp current cancel circuit is configured to connect the inverse ramp signal line to the first reference voltage line via the cancel capacitor.

11. The solid-state imaging device according to claim 3, wherein the first capacitor and the second capacitor have substantially same capacitance.

12. The solid-state imaging device according to claim 3, wherein the comparator is configured to adjust the number of capacitors connected between the second input terminal, and the first reference voltage line and the second reference voltage line, and configured to adjust a magnitude of the first reference voltage and the second reference voltage inputted to the second input terminal.

13. The solid-state imaging device according to claim 3, wherein the amplifier is a first amplifier,
wherein the comparator further comprises a third capacitor, a fourth capacitor, a second amplifier, and a binarization circuit, and
wherein a first output terminal of the first amplifier is connected to one input terminal of the second amplifier via the third capacitor, and a second output terminal of the first amplifier is connected to the other input terminal of the second amplifier via the fourth capacitor, and an output terminal of the second amplifier is connected to the binarization circuit.

14. The solid-state imaging device according to claim 13, wherein a third amplifier is further connected between the second amplifier and the binarization circuit.

15. The solid-state imaging device according to claim 13, wherein a power supply voltage of the second amplifier is different from a power supply voltage of the first amplifier.

16. A solid-state imaging device comprising:
   a pixel configured to output a luminance signal voltage corresponding to an incident light amount to a luminance signal line;
   a reference voltage generating circuit configured to output a first reference voltage to a first reference voltage line, a second reference voltage to a second reference voltage line, a ramp signal having a predetermined slew rate to a ramp signal line, and an inverse ramp signal having a different direction with the ramp signal to an inverse ramp signal line; and
   an AD converter configured to preform AD conversion of the luminance signal voltage;
   wherein the AD converter comprises:
      a comparator comprising an amplifier, the amplifier comprising a first input terminal coupled to the luminance signal line, and a second input terminal configured to connect or disconnect with the first reference voltage line, the second reference voltage line, and the ramp signal line respectively; and
      a ramp current cancel circuit configured to connect or disconnect the inverse ramp signal line with the first reference voltage line and second reference voltage line respectively.
   wherein the comparator comprises:
      a first switch configured to switch on/off between a first capacitor and the first reference voltage line,
      a second switch configured to switch on/off between the first capacitor and the ramp signal line,
      a third switch configured to switch on/off between the first capacitor and the second reference voltage line,
      a fourth switch configured to switch on/off between a second capacitor and the first reference voltage line, and
      a fifth switch configured to switch on/off between the second capacitor and the ramp signal line, and
   wherein the ramp current cancel circuit comprises:
      a first cancel switch configured to switch on/off between a cancel capacitor and the first reference voltage, and
      a second cancel switch configured to switch on/off between the cancel capacitor and the second reference voltage.

17. The solid-state imaging device according to claim 16, wherein
   the comparator comprises a plurality of first sets, the first set including the first switch, the second switch, the third switch, and the fourth switch, and
   the ramp current cancel circuit comprises a plurality of second sets, the second set including the first cancel switch and the second cancel switch.

18. The solid-state imaging device according to claim 16, wherein
   the pixel comprises a photodiode, and a dark voltage being voltage before transferring a charge from photodiode is outputted to the luminance signal line as the luminance signal voltage, and
   the second switch, the fourth switch, and the first cancel switch are switched on, and the first switch, the third switch, and the fifth switch, and the second cancel switch are switched off.

19. The solid-state imaging device according to claim 16, wherein
   the pixel comprises a photodiode, and a signal voltage, the signal voltage being generated by transferring charges from the photodiode by photoelectrically conversion, is outputted to the luminance signal line as the luminance signal voltage.

20. The solid-state imaging device according to claim 19, wherein
   the third switch and the fourth switch are switched on, and the first switch, the second switch, the fifth switch, the first cancel switch and the second cancel switch are switched off.

* * * * *